(12) United States Patent
Kuhara et al.

(10) Patent No.: US 6,733,190 B2
(45) Date of Patent: May 11, 2004

(54) OPTICAL COMMUNICATION DEVICE

(75) Inventors: Yoshiki Kuhara, Osaka (JP); Naoyuki Yamabayashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 483 days.

(21) Appl. No.: 09/885,173

(22) Filed: Jun. 21, 2001

(65) Prior Publication Data

US 2002/0037143 A1 Mar. 28, 2002

(30) Foreign Application Priority Data

Aug. 7, 2000 (JP) ........................................ 2000-238002

(51) Int. Cl.$^7$ ................................................ G02B 6/36
(52) U.S. Cl. .......................... 385/94; 385/49; 385/88; 385/92
(58) Field of Search .............................. 385/49, 88, 89, 385/90, 91, 92, 93, 94

(56) References Cited

U.S. PATENT DOCUMENTS

| | | | | |
|---|---|---|---|---|
| 6,270,263 B1 | * | 8/2001 | Iwase et al. ................. | 385/92 |
| 6,435,734 B2 | * | 8/2002 | Okada et al. ................. | 385/88 |
| 6,478,477 B1 | * | 11/2002 | Yamaguchi ................. | 385/80 |
| 6,524,017 B2 | * | 2/2003 | Lecocq et al. ................. | 385/88 |
| 6,567,590 B1 | * | 5/2003 | Okada et al. ................. | 385/49 |
| 6,603,782 B2 | * | 8/2003 | Nakanishi et al. ............ | 372/36 |

FOREIGN PATENT DOCUMENTS

| | | |
|---|---|---|
| JP | 60-176003 | 9/1985 |
| JP | 5-88041 | 4/1993 |
| JP | 7-181343 | 7/1995 |
| JP | 11-119064 | 4/1999 |

OTHER PUBLICATIONS

T. Nishikawa, et al., "Surface Mounting LD Module on Silicon Substrate," The Insititute of Electronics, Information and Communication Engineers Overall Conference, 1997, C–3–63, p. 248 (document in Japanese language with English translation attached).

J. Sasaki, et al., "Si bench for highly optical coupling using passively–aligned spot–size converter integrated laser diode," The Institute of Electronics, Information and Communication Engineers Overall Conference, 1997, C–3–65, p. 250 (document in Japanese language with English translation attached).

A. Hirai, et al., "Silicon V–Groove Substrate for Optical Modules," The Insititute of Electronics, Information and Communication Engineers Overall Conference, 1997, C–3–66, p. 251 (document in Japanese language with English translation attached).

Cover of The 1997 General Conference of The Institute of Electronics, Information and Communication Engineers Overall Conference held Mar. 24–27, 1997 at Kansai University, Suita.

* cited by examiner

Primary Examiner—Phan T. H. Palmer
Assistant Examiner—Jennifer Doan
(74) Attorney, Agent, or Firm—Smith, Gambrell & Russell, LLP

(57) ABSTRACT

An optical communication device having an optical fiber, other optical parts, a transparent potting resin with a refractive index akin to the fiber and a pressurizing element with extra pressure in contact with the potting resin for applying positive pressure upon the potting resin with a predetermined temperature range. The present optical communication device can solve the problems of decline of sensitivity of PDs and instability of the oscillation of LDs in a low temperature region between −40° C. and 0° C. after a heat cycle test.

50 Claims, 16 Drawing Sheets

EMBODIMENT 1

PLC type

Fig.15　EMBODIMENT 1
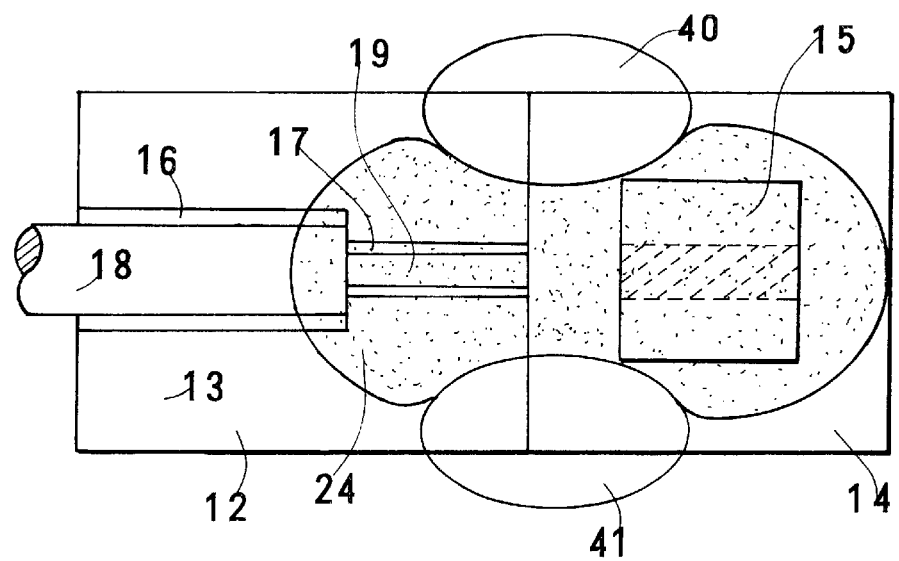
Fig.16　EMBODIMENT 1
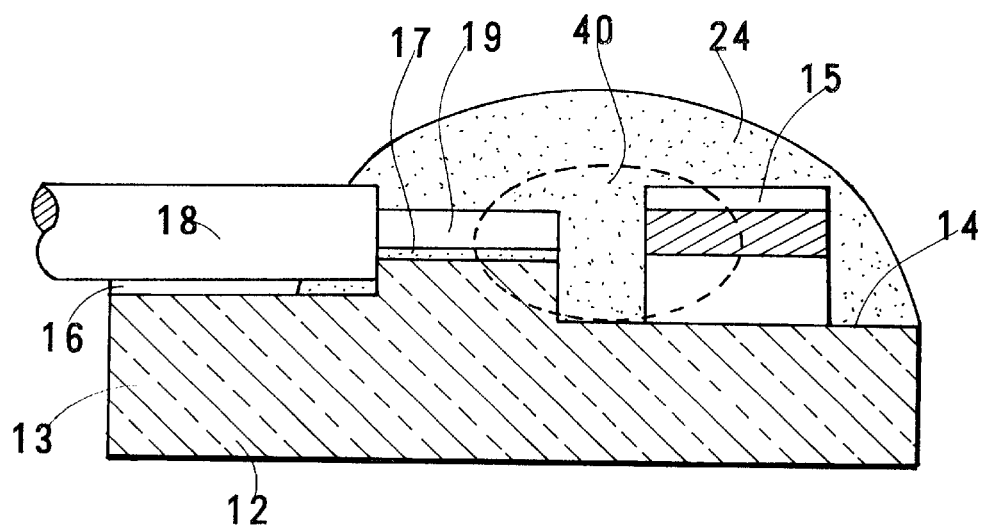

EMBODIMENT 1 at room temperature

EMBODIMENT 1 at the lowest limit of temperature (-40°C)

EMBODIMENT 2

EMBODIMENT 2

EMBODIMENT 3

EMBODIMENT 3

EMBODIMENT 4

EMBODIMENT 4

EMBODIMENT 5

EMBODIMENT 6

EMBODIMENT 7

EMBODIMENT 8

EMBODIMENT 9

Fig.30 EMBODIMENT 10
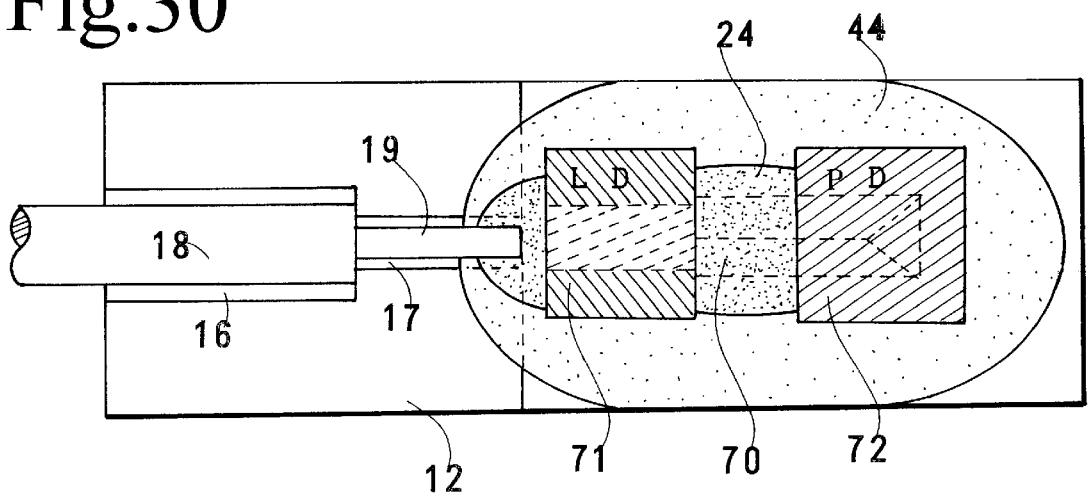
Fig.31 EMBODIMENT 10
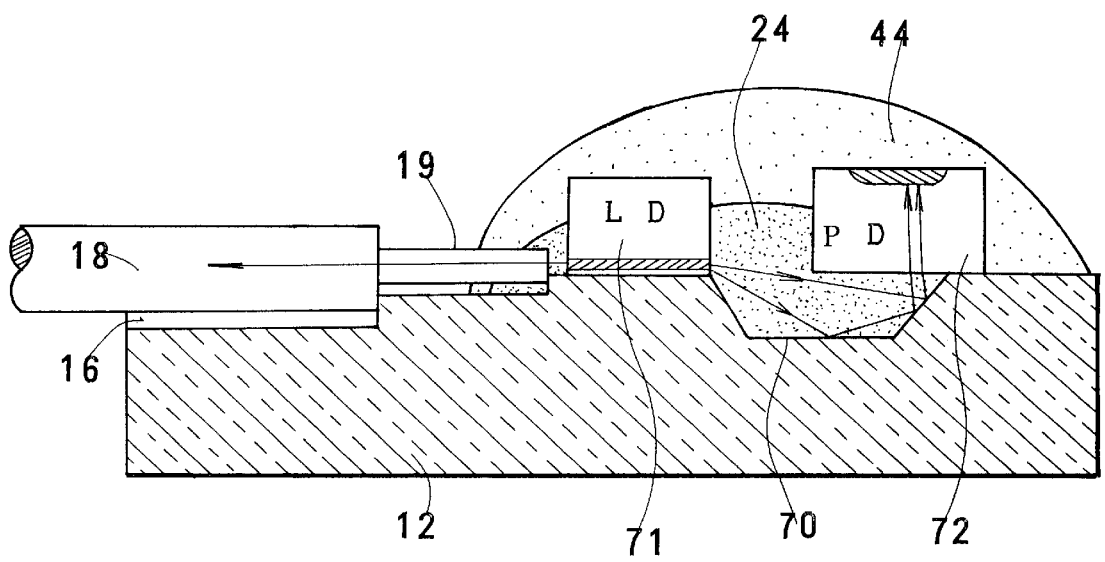

OPTICAL COMMUNICATION DEVICE

BACKGROUND OF THE INVENTION

1. Field of the Invention

This invention relates to an optical communication device, for example, an optical transmitting device (LED module or LD module), an optical receiving device (PD device), an optical transmitting/receiving device (LD/PD module or LED/PD module), a WDM filter and other optical devices. The aim of the present invention is to reduce the temperature dependence of the optical properties of the optical communication devices.

This application claims the priority of Japanese Patent Application No. 2000-238002 filed on Aug. 7, 2000 which is incorporated herein by reference.

2. Description of Related Art

An example of the most prevalent PD modules is shown in FIG. 1. The PD module has intrinsically a three-dimensional structure stored in a metallic package. The metallic package has a metallic disc stem 2 having pins 1 below the bottom. A photodiode (PD) chip 4 is mounted via a submount 3 upon the stem 2. A cylindrical cap 6 having a lens 5 is fixed upon the stem 2 above the PD 4. A cylindrical sleeve 7 having an opening above the cap 6 is welded upon the stem 2 at a bottom end. A ferrule 8 is inserted into the axial opening of the sleeve 7. The ferrule 8 seizes an end of an optical fiber 9. The bottom ends of the ferrule 8 and the fiber 9 are slantingly polished.

An elastic bend-limiter 10 is attached to the top of the sleeve 7. The optical fiber 9 carries optical signal light from another unit or a station. The signal light emitted from the optical fiber 9 propagates in the space, passes the lens 5 and enters the PD chip 4 at right angles. The sleeve 7 is aligned by giving light to the fiber 9, moving the sleeve 7 in two-dimensional directions (x and y directions), measuring the light power by the PD 4 and searching the spot which brings the maximum power to the PD 4, and fixed to the most suitable spot. The positive two-dimensional or one-dimensional alignment is indispensable for such a three-dimensional type module for optimizing the spots of the parts. The ferrule 8 is also aligned in the z-direction by supplying test light to the fiber 9, moving the ferrule 8 in the axial direction (z-direction) and seeking the spot for giving the maximum power to the PD, and fixed at the most suitable spot. The cap 6, the sleeve 7 and the ferrule 8 require the alignment. The PD module shown in FIG. 1 is now the most prevalent module which excels in sensitivity, reliability and life time. A similar metallic packaged LD module is also prevalent in the present optical communication networks. The pervasive modules, however, have weak points of the indispensable alignment, the large size and the high cost. A further progress of the optical communication requires a still more reduction of the sizes and costs of LD modules and PD modules. Recent researches are ardently directed to the planar lightguide circuit (PLC) type optical devices.

① T. Nishikawa, Y. Inaba, G. Tohmon, T. Uno, Y. Matsui, "Surface Mounting LD Module on a Silicon Substrate", PROCEEDINGS OF THE 1997 IEICE GENERAL CONFERENCE, C-3-63, p248 (1997), ② Jun-ichi Sasaki, Masataka Itoh, Hiroyuki Yamazaki, Masayuki Yamaguchi, "Si bench for highly efficient optical coupling using passively-aligned spot-size converter integrated laser diode", PROCEEDINGS OF THE 1997 IEICE GENERAL CONFERENCE, C-3-65, p250 (1997), ③ A. Hirai, R. Kaku, T. Maezawa, K. Takayama, T. Harada, "Silicon V-Groove Substrate for Optical Modules", PROCEEDINGS OF THE 1997 IEICE GENERAL CONFERENCE, C-3-66, p251 (1997).

These reports propose some kinds of PLC type LD modules and PD modules. These proposed improvements have not been manufactured yet on the practical scale.

An example of the simplest PLC type PD modules is shown in FIG. 2 (plan view) and FIG. 3 (sectional view). The PD module 11 has a silicon bench 12 with an upper step 13 and a lower step 14. The upper step 13 supports an optical fiber 19 and the lower step 14 sustains a PD (photodiode) 15. The PD 15 is a waveguide type PD having a horizontal waveguide with a horizontal sensing region 22. The Si bench 12 has V-grooves 16 and 17 formed in the axial direction by anisotropic etching.

The fiber 19 is partially held by a ferrule 18. The ferrule 18 and the fiber 19 are fixed upon the V-grooves 16 and 17. Another end of the ferrule can be attached to or detached from another optical device. The end 20 of the optical fiber is vertical to the light axis. Light 21 emanating from the end 20 of the optical fiber 19 enters the front end 23 of the PD 15, propagates in the waveguide sensing region 22 and induces photocurrent in the PD 15. The photocurrent is the receiving signal. In the module, the LD is mounted on the same substrate as the PD. The core of the fiber 19 and the sensing region 22 of the PD 15 lie horizontally on a straight line. The PD module 11 is built without alignment. Exclusion of the alignment reduces the cost of manufacturing the PD module 11. Elimination of the lens decreases the part cost. Thus, the module would be a small sized inexpensive PD module. A similar PLC type LD module can be obtained in a similar manner by replacing the PD by an LD in FIG. 2 and FIG. 3.

The prior art of the figures places the optical parts (the PD 15, the ferrule 18 and the fiber 19) on the Si bench 12 horizontally. The fiber 19 is directly coupled to the PD 15 without lens, which reduces the number of parts and the size of the module.

The example makes use of the optical fiber 19 as a medium for introducing the signal light to the module. The optical fiber can be replaced by a light waveguide. The waveguide (front end incidence) type PD can be also replaced by a top-incidence type PD or a bottom-incidence type PD. The situation is similar to the LD module which emits signal light toward the fiber.

The prior art of PLC type modules make V-grooves by anisotropic etching on the single-crystal silicon bench and prints positioning marks on the silicon bench for determining the position of a PD chip or an LD chip. The V-grooves and the positioning marks enable the manufacturers to mount the PD, the LD and the fiber at the desired positions with accuracy. The mounting of the parts at the spots in accordance with the guidance of the marks or the V-grooves is called "passive alignment" in contrast to the active alignment of the prior art of FIG. 1. The passive alignment enables the PLC type module of FIG. 2 and FIG. 3 to reduce the cost of assembly, the cost of parts and the cost of packaging.

The prior art of FIG. 2 and FIG. 3 has an apparent drawback of the big refractive index difference among the fiber, the PD and the air gap. The large refractive index difference would induce strong reflection at the boundaries of the air and the PD or the fiber. The reflection would arise the difficult problem of the returning light to the LD as well as the energy loss by the reflection. The reflection loss increases in proportion to the square of the refractive index difference. The LD returning light induces instability of the LD oscillation.

An ordinary remedy for reducing the reflection is to fill the air gap between a fiber end 26 and the PD (or LD) with a transparent resin 24, as shown in FIG. 4 or FIG. 5. The transparent resin 24 prevents the signal light from reflecting at the fiber end 26. Silicone-type resins or acrylate-type resins having a refractive index nearly equal to the fiber refractive index (n=1.4~1.5) are often chosen as the transparent resin. The reflection is reduced nearly to zero at the fiber end since the transparent resin has a refractive index akin to the fiber. Someone have proposed such contrivances of filling the resin for reducing the reflection at the fiber end.

④ Japanese Patent Laying Open No. 7-181343, (181343/'95) "Optical waveguide part and manufacture of the same", suggested a PD module having a waveguide type PD with a slantingly polished front end and a fiber with an end polished slantingly which is glued with an adhesive to the slanting end of the PD. The adhesive which has a similar refractive index to the fiber preferably.

⑤ Japanese Patent Laying Open No. 5-88041, (88041/'93) "Optical connecting circuit of optical fiber", proposed an optical connection built by inserting two slantingly polished fibers in a glass tube from both ends, supplying an transparent adhesive to the tube via a hole and gluing the ends of the fibers with each other in the tube. The refractive index of the adhesive is nearly equal to the fiber for reducing the reflection loss.

⑥ Japanese Patent Laying Open No. 60-176003, (176003/'85), "light power attenuator", suggested a fiber connection made by inserting two fibers into a tube filling an adhesive which has refractive index similar to the fibers at the middle to the tube. The attenuation of light power is controlled by changing the distance between the fiber ends.

⑦ Japanese Patent Laying Open No. 4-74483, (74483/'92), "Semiconductor light emitting-device", proposed an LD module having an LD, an optical fiber and a resin-coated junction between the LD and the optical fiber. The resin has a refraction index akin to the fiber.

Many proposals have been filed for reducing the reflection loss at the interfaces between a fiber and a PD, between a fiber and an LD and between fibers by supplying the interfaces with a resin having a refractive index akin to the fiber. These proposals are basically similar to the device of FIG. 4 and FIG. 5. Then, the prior art is described by referring to FIG. 4 and FIG. 5 having a PD or an LD as a typical example.

No problem would occur when the modules are always used in the circumstance at a stable or constant temperature. The surrounding temperature depends upon the regions, the seasons, and the time in a day. Then, electronic devices or optoelectronic devices are required to be available without malfunction in a wide temperature range between −40° C. and +80° C.

In addition to the applicability to the wide temperature range, the devices are also required to be resistant without inducing degeneration against the frequent temperature changes. Then, a heat cycle test which heats and cools an object device determined times in the temperature range is carried out for examining the temperature property.

The Inventors found that the heat cycle test brings about a decline of sensitivity of the PD and instability of the oscillation of the LD in the lower temperature region between −40° C. and 0° C. in the prior device of FIG. 4 and FIG. 5. The prior art from ④ to ⑦ were unaware of the malfunctions of the devices induced by the heat cycle test. The Inventors have discovered the malfunctions of the PD sensitivity reduction or the LD instability after the heat cycle test for the first time.

FIG. 6 is a graph of the change of the sensitivity as a function of temperature of Sample A (○) and Sample B (▲) of InGaAs-PDs after the heat cycle test. The abscissa is the surrounding temperature (° C.). The ordinate is sensitivity (A/W) of the PDs. Sample A denoted by ○ has nearly constant sensitivity higher than 1.0 A/W through the wide temperature range between −40° C. and +80° C. Sample B denoted by ▲, however, reveals serious degradation at the lower temperature region. The sensitivity of Sample B falls to 0.6 A/W at −40° C.

These PDs have been manufactured in the same manner by the same processes. The Inventors found the fact that some reveal good properties but others show bad sensitivity at the lower temperature range. What causes the fall of the sensitivity at the lower part of the required temperature range? The curve of ▲ is reversible. When Sample B is heated above 25° C., the sensitivity recovers the high values above 1.0 A/W. Sample B can be applicable to the surroundings warmer than 0° C. However, PD module should satisfy the requirement of the workableness down to −40° C. Then, Sample B should be rejected as a defective one. What is the reason of inducing the low temperature sensitivity degradation of the PD? Why is the sensitivity fall not irreversible but reversible? What invites the low temperature PD sensitivity fall? The Inventors failed in finding reports discussing the problem. The low temperature sensitivity fall is novel itself as a problem for PDs.

The Inventors have become aware of another problem of LDs at a low temperature. The problem of LDs which is different from the mentioned problem of PDs also occurs at the low temperature region. The Inventors have made an LD module having an LD 27, a fiber 28 and a transparent resin 24 covering the air gap between the LD and the fiber, as shown in FIG. 7. The heat cycle test is applied to the LD module. The LD was damaged by the heat cycle test in many points. The heat cycle brings about various defaults at a lower temperatures to the LD module.

One defect is the reduction of the light emission power in accordance with the fall of the temperature. Another default is an increment of returning light 29 reflected at the fiber end, as shown in FIG. 7. A further problem is an occurrence of the kinks (irregular curves) in the relation between the driving current and the LD emission power, as shown in FIG. 8. A fourth defect is an occurrence of double peaks 30 and 31 in the emission spectrum of the LD as shown in FIG. 9. The emission power decline, the increment of the reflection-returning light, the occurrence of the kinks in the current/power relation and the occurrence of double peaks in the emission spectrum are fatal drawbacks for LD modules? What generates such problems? Why are the drawbacks invited in PLC type LD modules?. None of the prior proposals above-mentioned say anything about the problems. None of the cited reports are aware of the existence of the problems.

The defaults will degrade the value of the LD modules or the PD modules as industrial products. Although the PLC can cut down the cost of LD or PD modules, the PLC type modules are still inapplicable to the actual communication system. There are still many problems to be conquered in the PLC technology.

SUMMARY OF THE INVENTION

The Inventors appreciate that it is indispensable to solve such problems in order to put the excellent PLC technology into industrial practice. The Inventors scrutinize the ground of the defaults in the resin-packaged modules induced by the heat cycle test. The Inventors observe the state of the resin of the LD modules and the PD modules after the heat cycle test. The microscope observation revealed a surprising fact. The microscope observation notified the Inventors that the resin was damaged by several kinds of air gaps.

As shown in FIG. 10 and FIG. 11, three kinds of defaults have happened in the resin. The defaults are as follows;
A. resin exfoliation at the interface between the potting resin and the fiber end, resin exfoliation at the interface between the PD end and the resin and the exfoliation between the LD end and the resin,
B. air bubbles occurring in the resin in the light path,
C. cracks happened in the resin.

These phenomena have happened in the resin of the PD modules or the LD modules after the heat cycle test. The phenomena are the grounds of the defaults mentioned above. It was a surprising fact which has no suggestion in any reports.

The three kinds air gaps induce the above-described imperfections. The crack C is a planar air gap induced in an intermediate region of the resin. The bubble B is a ball air gap happened in an intermediate region of the resin. The exfoliation A is an air gap appearing at the boundary between an optical part and a resin. Here, the exfoliation which is a ground of making an air gap is here used for expressing the result. These terms indicate all the air gaps occurring in the resin. The terms of the exfoliation A, the bubbles B and the cracks C are named for distinguishing the air gaps by the shapes or the origins.

The exfoliation A results in an increase of the reflection loss at the device end. In the case of the LD, the exfoliation A induces an increment of the reflection-returning light which instabilizes the LD oscillation.

The cracks C and the bubbles B do not only increase the reflection loss but also induce diverging loss of the signal light like concave lenses. Since the bubbles or the cracks are the air gaps with a refractive index (n=1) lower than the resin, they act as concave lenses in the resin. The LD modules or the PD modules are designed on the assumption that the light beams make their straight way in the transparent resin. However, the cracks, the bubbles and the exfoliation will scatter, reflect, refract and diverge randomly in the LD modules or the PD modules. The random reflection, extra refraction, scattering and diverging the signal light will reduce the sensitivity of the PD, the emission power of the LD and instabilize the oscillation mode of the LD.

What induces the decline of the PD sensitivity, the kinks of the LD current/power relation and the double peaks in the LD emission spectrum is the cracks C, the bubbles B and the exfoliation A generated in the resin of the LD modules or the PD modules.

The Inventors intensively considered the reasons why the air gaps incur such as the exfoliation, the cracks or the bubbles. The potting resin is one of the ultraviolet-hardening resins which are hardened by ultraviolet rays radiation at room temperature or one of the thermally-hardened resins which are hardened by heating at, for example, 100° C. or 150° C.

Thus, the resin will stably fill the space in the modules without air gap at room temperature or higher than the room temperature.

A rigorous surrounding condition requires workableness at −40° C. for the PD or the LD modules. The Inventors became aware that the large temperature difference between −40° C. and the room temperature incurs the serious problems.

A fall of the temperature invites shrinkage for almost all resins. The potting resins of the communication devices also shrink when the surrounding temperature lowers. An elasticity-rich resin would be able to alleviate the inner stress by allotting the shrinkage selectively to extra, free parts of the resin. The shrunk parts again dilate when the module is heated. But the whole volume is kept to be constant by the external hard package. The package prohibits the resins from dilating or reducing freely. The heat-cycle does not change the actual volume but varies the inner stress higher or lower in the resin. Cooling reduces the inner stress and heating raises the inner stress in the package-restricted resin. The heat cycle induces a cyclic change of the inner stress in the hard package. However, the change is not fully reversible. Repetitions of expansions and shrinks deprive the resin of the inherent elasticity. The heat cycle test facilitates aging of the resin. The heat-cycle-aged resin alleviates the inner stress at the heated and dilated state by permanent shrinkage. The permanent shrink increases the expansion inner stress at the cooled shrunk state. The loss of elasticity of the resin cannot compensate the excess tensile stress. Then, the excess tensile stress forces the resin at the joints to exfoliate from the fiber end, the PD front or the LD front, when the adhesive force is weak, as shown in FIG. 10 and FIG. 11. When the adhesive force is stronger than the tensile stress, the excess tensile force makes cracks (C) in the intermediate regions of the resin. The exfoliation (A) and the cracks (C) appear at a low temperature. When the module is heated, the exfoliation (A) and the cracks (C) temporarily disappear, because adjacent resin dilates and kills the gaps. But when it is cooled, the exfoliation (A) and the cracks (C) are revived.

Otherwise, air bubbles (B) which have been generated at the resin-hardening time and have been pressurized in the resin dilate and expand in the heat-cycle-aged resin with poor elasticity at a low temperature. The origins of the air bubbles are inherent bubbles contained in the prehardened, fluid resin, newly-born bubbles occurring at the small cavities of solid parts or newly-made bubbles induced by unwettability of the surfaces of solid parts. The air bubbles disappear at a heated state, since the surrounding resin dilates. The air bubbles expand and dilate at a cooled state, since the adjacent resin shrinks. It was revealed by the present Inventor's searches that the exfoliation (A), the cracks (C) and the bubbles (B) which have been generated in the potting resin raise various problems above-mentioned. The exfoliation (A) between the PD and the resin incur the reflection whenever the light pass the different mediums among the resin, space and the PD, as shown in FIG. 10. The reflection loss is increased by exfoliation. The same things are induced by the exfoliation generated between the fiber and the resin. The increment of the reflection loss is remarkable. The decrease of the intake power reduces the sensitivity of the PD. At a high temperature, the exfoliation (A), the cracks (C) and the bubbles (B) disappear, the reflection loss decreases and the sensitivity of the PD rises. Serious degradation of Sample B, as shown in FIG. 6, now clear the cause.

In the case of the LD, the exfoliation (A), the cracks (C) and the bubbles (B) invite increments of the reflection loss and reflection-returning light. It's understandable that the increment of the reflection-returning light makes the kinks, as shown in FIG. 8 and it is also reasonable that an occurrence of double peaks in the emission spectrum of the LD is induced by the increment of the reflection-returning light.

Nobody have expected that silicone-type resins or acrylate-type resins constructing the potting resin which are so elastic happens the exfoliation and the cracks in the potting resin. The heat-cycle generates the exfoliation (A), the cracks (C) and the bubbles (B) in the resin. When the optical devices are maintained at high temperatures, the expansion of the resin conceals the exfoliation (A), the cracks (C) and the bubbles (B). But the optical devices are cooled to low temperatures, the resin shrinkage reveals the exfoliation (A), the cracks (C) and the bubbles (B) in the resin. The ground of inviting the defaults above-mentioned turns out to be the exfoliation (A), the cracks (C) and the bubbles (B) in the resin.

The above analysis suggested a remedy of solving the difficulty by pressurizing the resin by some means to the Inventors. Excess pressurizing would suppress the resin from producing the exfoliation (A), the cracks (C) and the bubbles (B) even at a low temperature. The defects of the exfoliation (A), the cracks (C) and the bubbles (B) are made by the tensile stress (positive inner stress), because the sign of the stress is physically defined as positive for tensile and negative for compressive. If negative (compressive) inner stress is given to the resin, the defects would not appear in the resin even at a low temperature. The problem would be conquered by pressurizing the resin by some contrivance at a low temperature.

The new concept of the present invention is to apply compressive forces showing by arrows D, E and F at all times to the resin as shown in FIG. 12 and FIG. 3. The pressurizing forces which should compress the resin are schematically denoted by the arrows D, E and F. The compressing forces should maintain extra pressure sufficient for suppressing the gap, the exfoliation or the cracks from occurring in the potting resin even at −40° C. In the highly-pressurized state, a cooling down to −40° C. would not generate the exfoliation (A), the cracks (C) and the bubbles (B), which would exclude the phenomenon of the low temperature sensitivity decline from the PDs. The excess pressurizing of the present invention would rescue the LDs from the increase of the returning light, the double peaks of the emission spectrum and the occurrence of the kinks in the current/power relationship.

The problem is now how to apply the extra pressure to the potting resin. How can the pressure be applied to the inner resin? What can allot the pressure to the resin at a low temperature? A decrease of temperature invites a reduction of pressure in any material due to the positive elasticity. It is difficult to apply pressure to the inner resin at a low temperature. It is, however, not entirely impossible. The Inventors thought of such a device which can afford to maintain the compressive stress in the resin at a low temperature and found a solution for the problem.

Namely, the Inventors obtained a new device which can give compressive stress to the potting resin for suppressing the defects (A), (B) and (C) from occurring. The present invention is based upon the discovery of ground of the sensitivity decline at a low temperature and the contrivance of eliminating the ground.

Till now, the skilled have commonly thought that the resin potting or the plastic molding should be done without applying extra pressure to parts in the device. They believed that the extra pressure would break or distort the inner parts. Too strong compressive stress would break the leads or the chips or distort the chips in the device, which incurs troubles. In the silicon semiconductor electric devices, for example, Si-ICs are sometimes enclosed by a silicone-type resin with rich elasticity. The elastic silicone-type resin protects the chips from compressive stress by the excellent elasticity. The elastic silicone resin-coated chips are further molded with a harder epoxy-type resin for protecting the device from external shocks by enhancing the mechanical strength. The inner softer potting resin need not be transparent. The outer part is a hard (epoxy resin) shell and the Si-IC chips are protected by the softer silicone type resin enclosed by the harder shell. The double resin structure consisting of the harder and softer resins is suitable for resin-packaging of the Si electronic ICs. The double resin packaging is prevalent in "electronic" devices.

The simple double resin structure is pertinent to the electronic parts or devices which require no consideration for light, since the parts or devices exchange no light among them. The soft resin potting for protecting chips has been already a common technique for electronic devices.

The potting of soft resins has been recently applied to PLC (planar lightwave circuit) type optoelectronic devices (fibers, waveguides, LDs, PDs or LEDs) which pitch and catch light among them. A harder epoxy resin forms an external package protecting the softer resin and the optoelectronic parts. The double structure applied to the optoelectronic devices is common to the prior electronic devices. But the softer potting resin should be transparent, because the devices exchange light via the potting resin. The main purpose of the resin is not to protect the optoelectronic devices from the external forces but to reduce the reflection loss at the interface between the devices and the fibers/waveguides. A soft, transparent resin which has a refractive index close to the fibers/waveguides should be chosen for the potting resin. No sooner had the double resin molding been applied to the PLC optoelectronic devices than the optoelectronic devices were beset with the mentioned problems: the low temperature sensitivity decline of PDs, the returning light increment, the current/power kinks and the multi-peak emission spectrum of LDs. Encountering the unexpected difficulties, all the skilled have been at a loss. There were two problems. One was the unknown ground of incurring the troubles. The other was lack of the remedy for the troubles.

The Inventors attributed the ground of the troubles to the exfoliation (A), the bubbles (B) and the cracks (C) appearing in the potting resin at a low temperature. The Inventors hit upon a new solution of giving extra pressure upon the potting resin at all times for prohibiting the resin from making the exfoliation (A), the bubbles (B) and the cracks (C) at a low temperature.

Pressurizing requires a closed, airtight vessel for determining the capacity of the space containing the resin and the device chips. The plastic mold type devices have outer shells made of a hard resin. e.g., epoxy resin. This invention makes the best use of the hard resin-molded outer shell as an airtight pressure vessel.

What can apply the extra pressure at all times to the potting resin for prohibiting the resin from making the defects at a low temperature? This is a difficult problem. The epoxy resin for building the outer shell which is a thermo-setting resin is hardened by heating up to a high temperature in a transferring molding machine. The pressure acting between the outer epoxy resin and the inner potting resin at the temperature is equal to the inner pressure in the metallic mould of the transferring molding machine. Then, the object resins are cooled to room temperature. The inner pressure is decreased but a positive pressure is still making compressive stress (negative stress) in the potting resin at room temperature.

The inner, softer potting resin has a larger thermal expansion coefficient than the outer harder resin, in general. A further fall of temperature gives the inner potting resin the tendency of shrinkage but the outer harder shell forces the inner softer resin to continue to fill the inner space due to the airtightness of the vessel (the space confined by the outer resin). The inner pressure is converted to negative (less than the atmospheric pressure). The negative pressure produces strong tensile stress in the potting resin. The tensile stress induces the exfoliation (A), the bubbles (B) and the cracks (C) in the potting resin. Since the temperature fall from the heated molding to the lowest limit (−40° C.) is quite large, the appearance of the exfoliation (A), the bubbles (B) and the cracks (C) is unavoidable in the conventional double resin packaging.

The present invention interposes a pressurizing element with affluent elasticity between the inner potting resin and the outer hard resin. The rich elasticity means low Young's modulus or low elastic coefficient which is a ratio of an increment of pressure to an increment of volume. The rich elasticity allows the pressurizing element to expand according to the fall of the temperature. The softness of the pressurizing element ensures the resin a positive pressure by expanding itself at low temperature. The pressurizing element is here called a "pressurizing balloon" or a "pressurizing resin". The pressurizing element has higher volume/pressure sensitivity than the potting resin. In brief, the pressurizing element is softer than the potting resin. "Softness" is equivalent to a low elastic coefficient, low Young's modulus and rich elasticity. "Softness" is conspicuous attribute of the pressurizing element.

The present invention maintains the positive pressure applying upon the potting resin by packaging the high pressure sensitive pressuring balloon or pressurizing resin under high initial pressure in contact with the potting resin at the outer (epoxy) resin moulding. The initial high pressure is determined to maintain the positive pressure in the package till the lowest limit (e.g., −40° C.) of the desired temperature range. Thus, the inner space always presses the pressurizing element to a size smaller than the normal state at the atmospheric pressure within the required temperature range. The pressurizing element gives the potting resin the extra pressure even at the lowest limit of temperature. The pressurizing element enables the potting resin to expel the exfoliation (A), the bubbles (B) and the cracks (C).

BRIEF DESCRIPTION OF THE DRAWINGS

FIG. 15 a plan view of a PD module of Embodiment 1 which has a PD, a fiber, a transparent potting resin between the fiber and the PD chip and pressurizing balloons being posed upon the sides of the potting resin for inhibiting the resin from generating the exfoliation, the cracks and the bubbles by giving extra pressure to the resin in the state before being enclosed by an outer hard resin.

FIG. 16 a vertically-sectioned view of the same PD module of Embodiment 1 as FIG. 15 which has a PD, a fiber, a transparent potting resin between the fiber and the PD chip and pressurizing balloons being posed upon the sides of the potting resin for inhibiting the resin from generating the exfoliation, the cracks and the bubbles by giving extra pressure to the resin in the state before being enclosed by an outer hard resin.

FIG. 30 a horizontally-sectioned view of an LD module of Embodiment 10 before packaging which has an LD, a bottom-incidence monitoring PD, a fiber, a ferrule, transparent potting resin layers filling the gaps between the fiber and the LD and between the LD and the PD, a pressurizing resin layer covering the top of the potting resin layers for inhibiting the resin from generating the exfoliation, the cracks and the bubbles by giving extra pressure to the resin layers.

FIG. 31 a vertically-sectioned view of the same LD module of Embodiment 10 as FIG. 30 before packaging, which has an LD, a bottom-incidence monitoring PD, a fiber, a ferrule, transparent potting resin layers filling the gaps between the fiber and the LD and between the LD and the PD, a pressurizing resin layer covering the top of the potting resin layers for inhibiting the resin from generating the exfoliation, the cracks and the bubbles by giving extra pressure to the resin layers.

DETAILED DESCRIPTION OF THE PREFERRED EMBODIMENTS

Figure 1:
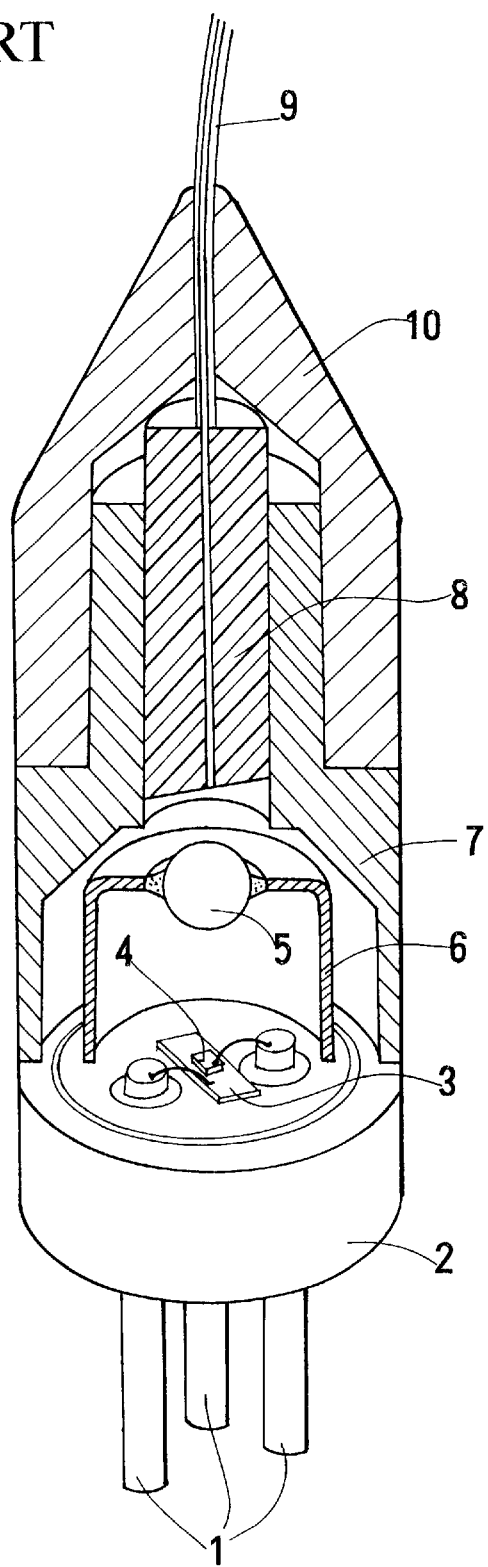
FIG. 1 is a perspective sectional view of a most prevalent PD module having a PD chip in a metallic cylindrical package.
Figure 2:
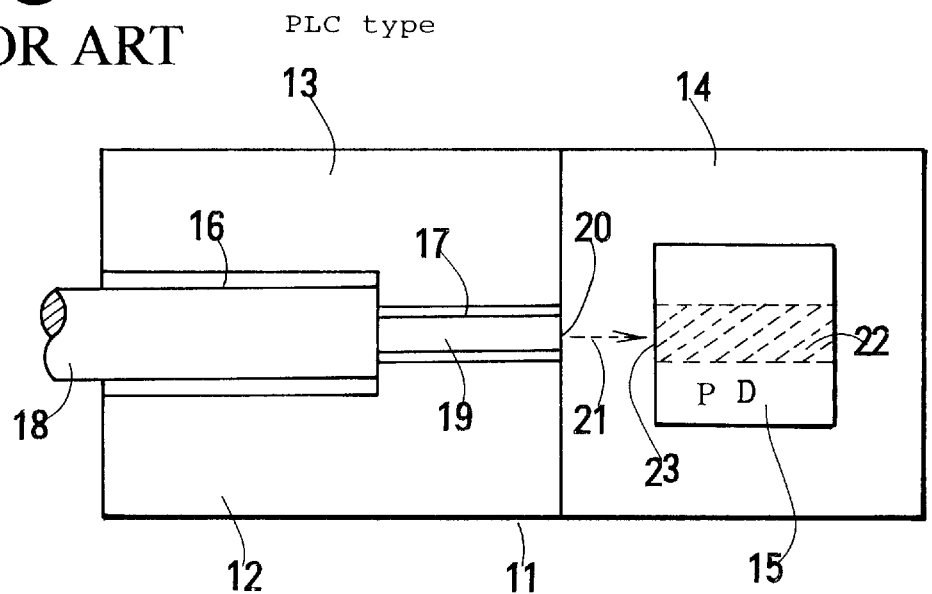
FIG. 2 is a plan view of one of the prior art PLC type PD modules.
Figure 3:
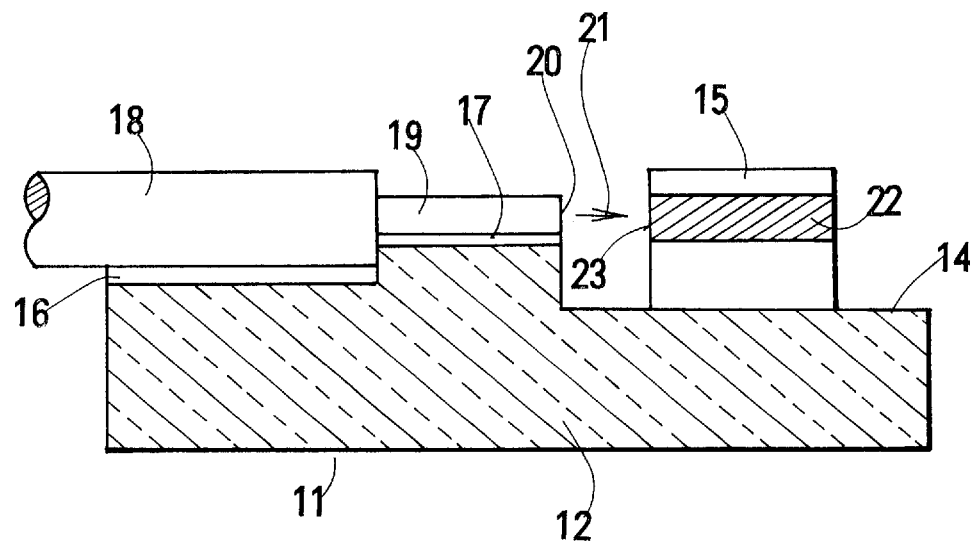
FIG. 3 is a sectional view of the same prior art PLC type PD module as FIG. 2.
Figure 4:
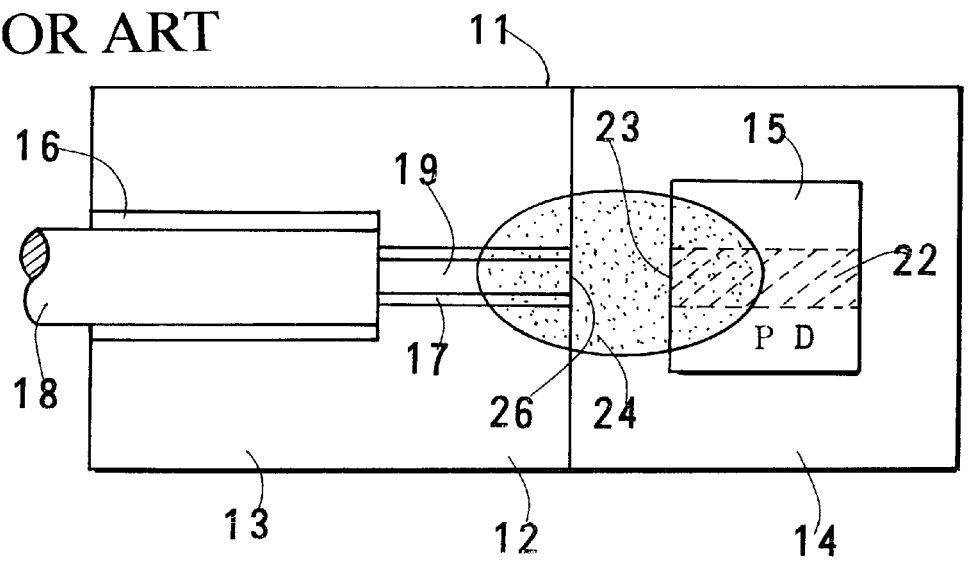
FIG. 4 is a plan view of one of the prior art PLC type PD module interposing a transparent potting resin between the fiber and the PD for reducing the reflection at the end of the fiber.
Figure 5:
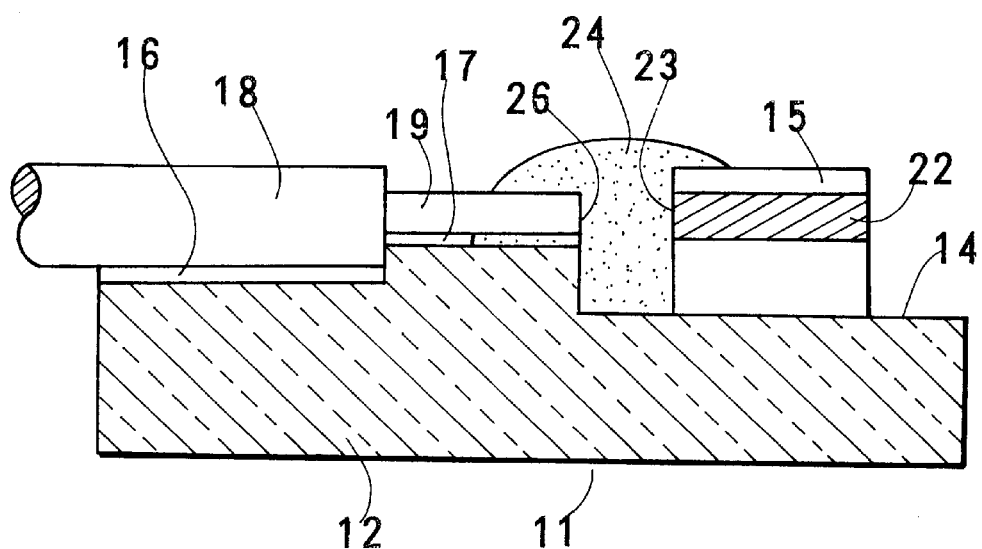
FIG. 5 is a sectional view of the same prior art PLC type PD module as FIG. 4.

The gist of the present invention is the inclusion of the pressurizing element maintaining extra pressure for applying positive pressure to the potting resin in a rigid package. The pressurizing element can maintain the sealed extra pressure against the heat cycle test. When the surrounding temperature falls, the pressurizing element dilates itself for compensating the shrinkage of the potting resin. The existence of the positive pressure inhibits the potting resin from generating exfoliation, bubbles or cracks.

There are two different categories for the pressurizing element. One is a balloon which subtly varies the shape and the volume in accordance with the temperature and the pressure. The other is an intermediately soft resin which expands or shrinks by variations of pressure and temperature. The rigid outer shell is a metallic package, a ready-made plastic package or a plastic molding package (e.g., epoxy resin molding). The inner volume of the outer shell changes little as a function of the pressure and the temperature. The change of the volume is very small in the ranges of temperature and pressure. Thus, it is safely assumed that the volume of the outer package is constant regardless of the pressure and temperature.

Here, the reason why the pressurizing element can allot the potting resin strong pressure enough to prevent the potting resin from producing exfoliation, cracks or air bubbles at a low temperature is now described with regard to both the cases of the balloon and the resin.

(1) Case 1 (Pressurizing Balloon)

A balloon consists of a closed elastic membrane and a gas sealed in the closed membrane. The gas is air, nitrogen gas, argon gas, neon gas or other rare gas. The volume of the balloon is easily varied as a function of pressure and temperature. "U" denotes a volume of the transparent potting resin. "V" is a volume of the pressurizing balloon. The inner volume of the outer shell is constant. Then, the constant inner volume of the outer shell (package) is determined to be 1 for the sake of simplicity. Namely, U is a normalized volume of the transparent potting resin. V is a normalized volume of the pressurizing balloon. There are only the transparent potting resin and the pressurizing balloon in the rigid outer shell.

$$V+U=1. \tag{1}$$

The pressure of the balloon (resin) is denoted by "P" and absolute temperature is denoted by "T". The volume V of the balloon obeys the Boyle-Charles law.

$$PV=hT. \tag{2}$$

Here, "h" is a product of a mole number of the gas contained in the balloon and the gas constant R. The transparent potting resin has an elasticity coefficient (Young's modulus) K and a volume expansion coefficient $\alpha$. A volume change $\Delta U$ of the potting resin induced by a temperature variation is given by $\Delta U = U_2\alpha(T-T_2)$, where $U_2$ is a volume at $T=T_2$. The volume change resulted from a pressure variation is $\Delta U = -U_2(P-P_2)/K$. A total volume change by changes of pressure and temperature is given by $$\Delta U = U_2\alpha(T-T_2) - U_2(P-P_2)/K, \tag{3}$$

where a suffix "2" means parameters at sealing (packaging) under high pressure at a high temperature. $T_2$ and $P_2$ are the temperature and the pressure at the packaging. When epoxy resin is hardened by transfermolding, the temperature is, for example, 180° C. In this case, $T_2=180°$ C.=453K. $P_2$ at the molding is higher than 1 atm of course.

On the contrary, suffix "1" denotes parameters at the lowest limit (e.g., −40° C.) of the temperature. In the case, $T_1=-40°$ C.=233K. A fall of temperature from $T_2$ (molding) to $T_1$ (the coolest limit) invites a balloon volume change, $$\Delta U = U_2\alpha(T_1-T_2) - U_2(P_1-P_2)/K. \tag{4}$$

$T_2$ and $P_2$ mean a high temperature and high pressure at sealing. $T_1$ and $P_1$ mean a low temperature and low pressure at the coolest limit (−40° C.). $(T_1-T_2)$ is negative. $(P_1-P_2)$ is also negative.

If the package contained no pressurizing balloon (prior art), the volume of the potting resin could not change ($\Delta U=0$). Under the restriction of the constant volume ($\Delta U=0$) the fall $(T_1-T_2)$ of temperature would invite a vast fall $(P_2-P_1)$ of pressure, $$P_2-P_1=\alpha K(T_2-T_1). \tag{5}$$

"$P_c$" denotes the critical pressure which generates exfoliation, bubbles and cracks. The lowest pressure $P_1$ at the lowest temperature $T_1$ would be smaller than the critical pressure $P_c$.

$$P_1<P_c. \tag{6}$$

Figure 6:
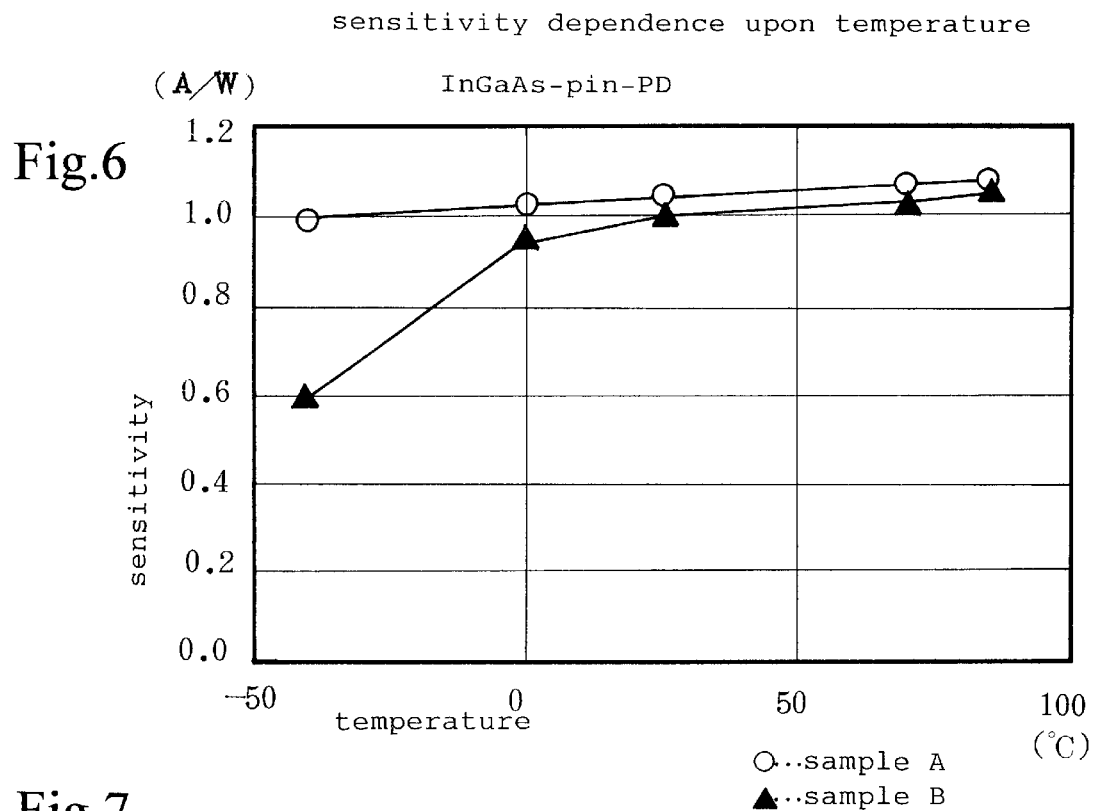
FIG. 6 is a graph showing the sensitivity of InGaAs-PD samples of FIG. 4 and FIG. 5 after the heat cycle test as a function of the surrounding temperature. ○ shows the data of Sample A. ▲ denotes the data of Sample B.
Figure 7:
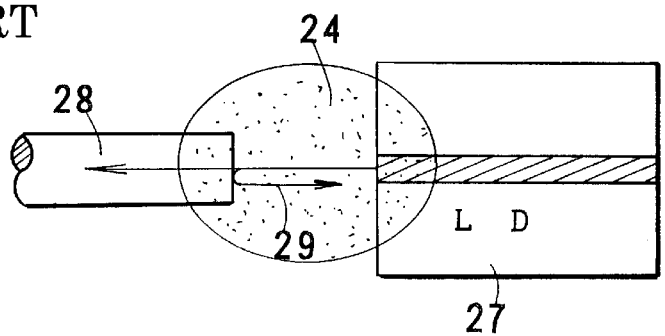
FIG. 7 is an explanatory figure for demonstrating an increase of the reflection at the fiber end in an LD module with a potting resin covering the gap between the fiber and the LD induced by the degradation caused by the heat cycle test.
Figure 8:
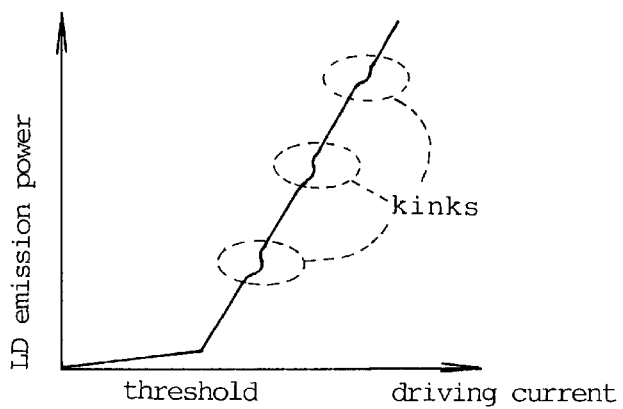
FIG. 8 is a graph of the emission power of the LD module with a potting resin covering the gap between the fiber and the LD as a function of the driving current for exhibiting the occurrence of kinks due to the degradation by the heat cycle.
Figure 9:
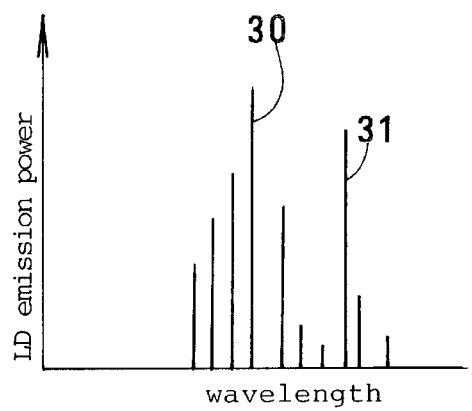
FIG. 9 is a emission spectrum of the LD module with a potting resin covering the gap between the fiber and the LD, which shows double peaks due caused by the heat cycle test.
Figure 10:
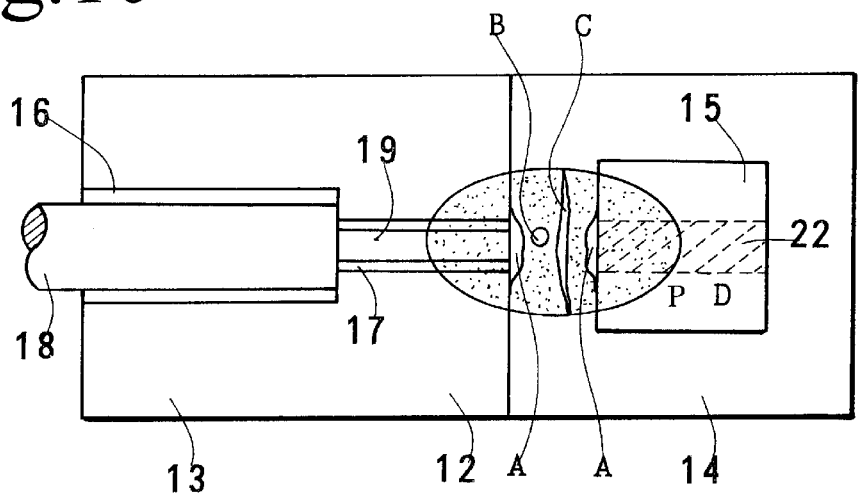
FIG. 10 is a plan view of a PD module with the potting resin which has experienced the heat cycle test for denoting the appearance of the exfoliation, the cracks and bubbles in the potting resin clarified by the microscope observation.
Figure 11:
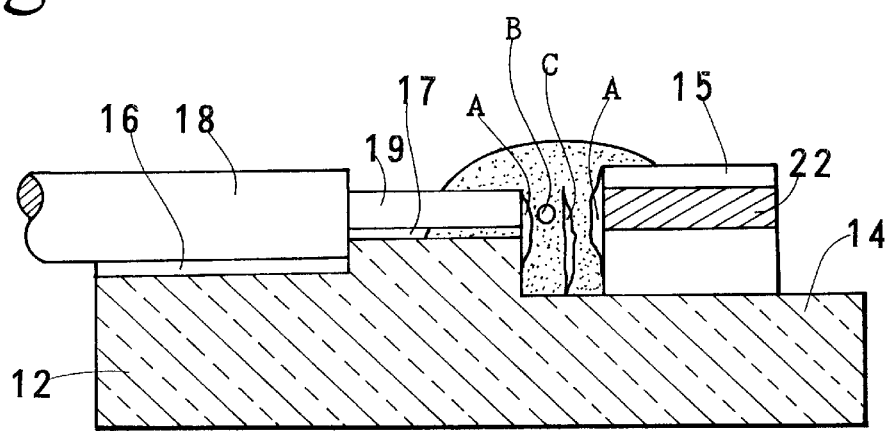
FIG. 11 is a sectional view of the same PD module as FIG. 10 which filled the gap between the fiber and the PD with a potting resin with a refractive index equal to the fiber and experienced the heat cycle test.
Figure 12:
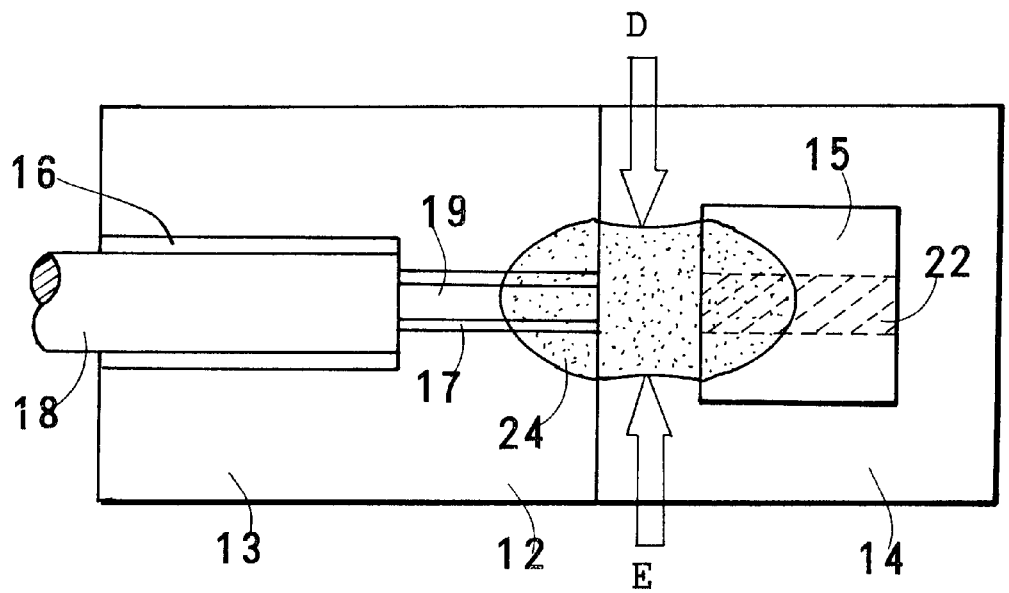
FIG. 12 is a plan view of a PD module of the present invention having a PD and a fiber, which applies extra pressure upon the transparent potting resin filling the gap between the fiber and the PD for prohibiting the exfoliation, the cracks and bubbles from occurring in the potting resin at a low temperature.
Figure 13:
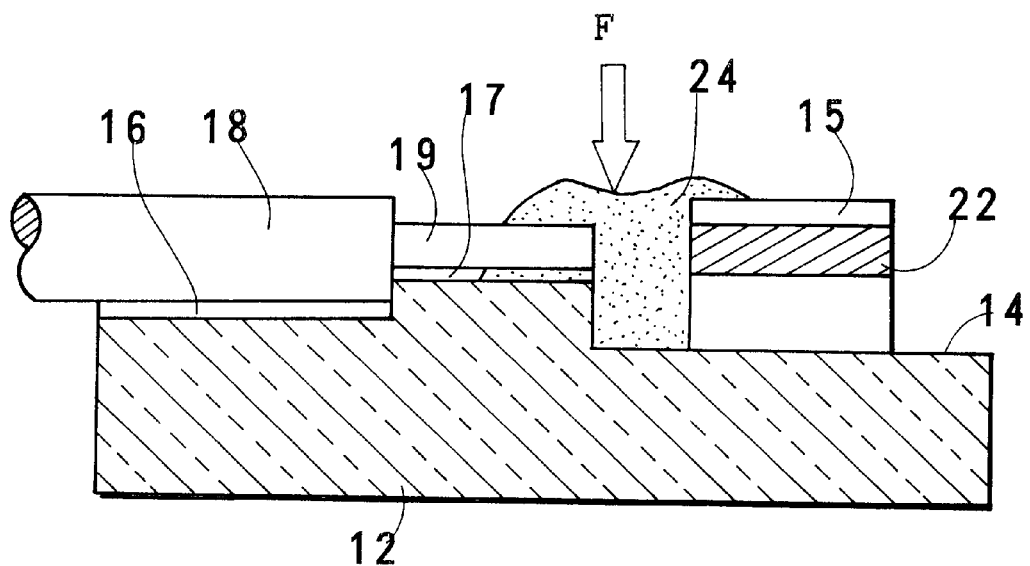
FIG. 13 is a sectional view of the same PD module of the present invention as FIG. 12 which applies extra pressure upon the transparent potting resin filling the gap between the fiber and the PD for prohibiting the exfoliation, the cracks and the bubbles from occurring in the potting resin at a low temperature.

The small pressure $P_1$ would invite exfoliation, bubbles and cracks in the potting resin at the coolest limit after the heat cycle test. The exfoliation, the bubbles and the cracks in the potting resin would scatter signal light in the prior PDs. This assumption can explain the serious fall (▲) of the sensitivity at the lowest temperature of Sample B in FIG. 6.

On the contrary, the present invention interposes the pressurizing balloon which alleviates the fall of the pressure at a low temperature in the package. The initial pressure $P_2$, the initial temperature $T_2$ and the initial volume $V_2$ of the balloon at packaging satisfy the Boyle-Charles law, $$P_2V_2=hT_2. \tag{7}$$

The final pressure $P_1$, the final temperature $T_1$ and the final volume $V_1$ of the balloon at the coolest limit also satisfy the Boyle-Charles law, $$P_1V_1=hT_1. \tag{8}$$

The initial volume $V_2$ of the balloon is a constant. The deviation of the volume of the balloon from $V_2$ is, $$\Delta V = V_1 - V_2 = \{(T_1P_2/T_2P_1)-1\}V_2. \tag{9}$$

Since the balloon is interposed in the package, Eq.(1) gives an alleviated condition $\Delta U + \Delta V = 0$ with regard to the change of the volume in the present invention. The requirement is not $\Delta U=0$ (prior art) but $\Delta U + \Delta V=0$ (present invention). The prior art ($\Delta U=0$) must submit to the drastic pressure decline shown by Eq.(5). The present invention makes use of the balloon expansion $-\Delta V$ for alleviating the pressure fall to a great extent. $\Delta U + \Delta V = 0$ means, $$U_2\alpha(T_1-T_2) - U_2(P_1-P_2)/K + \{(T_1P_2/T_2P_1)-1\}V_2 = 0. \tag{10}$$

Here $\beta$ is defined as a ratio $V_2/U_2$ of the balloon volume $V_2$ to the resin volume $U_2$ at packaging ($\beta=V_2/U_2$).

$$K^{-1}(P_2-P_1) + \beta\{(T_1P_2/T_2P_1)-1\} = \alpha(T_2-T_1). \tag{11}$$

The second term of the left-hand side corresponds to the addition of the pressurizing balloon. $T_1$, $T_2$ and $P_2$ are known parameters. $P_1$ is an unknown variable. The solution $P_1$ of Eq.(11) is given by, $$P_1 = \frac{-\{K\alpha(T_2-T_1)+\beta K - P_2\} + \sqrt{\{K\alpha(T_2-T_1)+\beta K - P_2\}^2 + \frac{4\beta K T_1}{T_2}P_2}}{2}. \tag{12}$$

This is a rigorous solution. When the exact values of $T_1$, $T_2$ and $P_2$ are known, the exact pressure $P_1$ at the coolest limit can be calculated from Eq.(12). The practical calculation should rely upon Eq.(12). Since the rigorous solution is complex, even the skilled cannot obtain intuition for the solution. Instead of the rigorous solution, the situation should now be considered upon an approximate solution. The volume elastic constant K of the potting resin is a large value. The product $\alpha K$ of the potting resin is minus two orders of magnitude (about $10^{-2}$) in atm unit of pressure (1 atm=760 Torr=0.1 MPa). In the left-hand side of Eq.(11), the first term is far smaller than the second term. Then, the second term is nearly equal to the right-hand side. The approximation leads to a rough solution, $$P_1 = \frac{T_1 P_2}{T_2\left\{1 + \frac{\alpha}{\beta}(T_2-T_1)\right\}}. \tag{13}$$

The approximated solution gives the limit at $1/K \to 0$ of Eq.(12). The second term $(\alpha/\beta)(T_2-T_1)$ in the bracket in the denominator of Eq.(13) denotes the diversity from the Boyle-Charles law in the balloon. Here "1" is the suffix of denoting the values at the lowest temperature limit and "2" is the suffix of the values at packaging (sealing) at a high temperature. Then $P_2$ is the pressure at the transfermolding in the case of the plastic molding package. It should be noted that the pressure is not the conventional Gauge pressure which defines the atmospheric pressure as 0 atm but the absolute pressure which defines true vacuum as 0 atm for the Boyle-Charles law. $\beta$ which is the ratio $V_2/U_2$ of the balloon volume to the resin volume is a freely adjustable parameter. $\alpha/\beta$ can be reduced by increasing the volume of the pressurizing balloon.

A larger $\alpha/\beta$ enlarges a pressure fall $(P_2-P_1)$ originating from the temperature decline $(T_2-T_1)$ and gives a lower pressure $P_1$ at the coolest limit ($-40°$ C.). $\alpha$ is $10^{-4}/°$ C. to $10^{-5}/°$ C. When the package is made by transfermolding at 180° C., the temperature fall is $T_2-T_1=180°$ C.$-(-40°$ C.$)=220°$ C. The value $(\alpha/\beta)(T_2-T_1)$ is far less than 1. In the case, the deviation from the Boyle-Charles law is small. As $\alpha/\beta$ approaches to 0, the balloon property follows the Boyle-Charles law more exactly.

In the absolute temperature unit, $T_2=453K$ and $T_1=233K$. For example, it is assumed that $\alpha=3\times10^{-4}$, $\beta=0.3$ ($\alpha$ is a volume expansion coefficient which is three times as large as the linear expansion coefficient). For the assumed parameters, the pressure $P_1$ at the lowest temperature limit $T_1$ is about half $(P_1=0.422P_2)$ of the packaging pressure $P_2$ at $T_2$. Here it should be noted that the pressure is expressed in absolute pressure unit which is obtained by adding 1 atm to the value in Gauge unit. When, for example, $P_2$(Gauge)=4 kg/cm$^2$=5 atm, $P_1$(Gauge)=1.1 kg/cm$^2$=2.1 atm. If $P_1$(Gauge)>0, there is compressive stress in the resin which prohibits exfoliation, cracks and bubbles from occurring.

On the contrary, if the device includes no pressurizing element (prior art), Eq.(5) $P_2-P_1=\alpha K(T_2-T_1)$ would determine the pressure $P_1$ at $T_1$. In the case of the transfermolding of 180° C., $T_2-T_1=220°$ C. For an example of $\alpha=3\times10^{-4}$, $K=3\times10^2$, $\alpha K(T_2-T_1)=20$. When the initial pressure $P_2$ were $P_2=6$ atm (5 kg/cm$^2$ in Gauge unit), the final pressure $P_1$ would be $P_1=-14$ atm ($-15$ kg/cm$^2$ in Gauge unit; in practice negative pressure is only imaginary.). This is only a simple example. In many cases, in the prior art, the pressure fall $\alpha K(T_2-T_1)$ would exceed $P_2$. Therefore, $P_1$ results in a negative one, which would induce the exfoliation, cracks and bubbles in the shrunk transparent potting resin.

The above estimation of the improvement obtained by the present invention is based upon the simplest approximation of Eq.(13). If the parameters have been known, the rigorous Eq.(12) gives an exact solution. The simplest approximation gives excessively severe restriction. More sophisticated approximation can be obtained from Eq.(11) by deeming $P_1$ in the first term of the left-hand side as constant and deeming $P_1$ in the second term of the left-hand side as variable.

$$P_1 = \frac{T_1 P_2}{T_2\left\{1+\frac{\alpha}{\beta}\left(T_2-T_1-\frac{P_2-P_1}{\alpha K}\right)\right\}} \quad (14)$$

The improved approximation Eq.(14) includes an extra term $-(P_2-P_1)/\alpha K$ in the denominator of the right-hand side in addition to Eq.(13). Since a negative term is added in the denominator, the $P_1$ of Eq.(14) is larger than the $P_1$ of Eq.(13). The former example based on Eq.(13) gave a positive pressure $P_1=1.1$ kg/cm$^2$=2.1 atm at the lowest temperature limit ($-40°$ C.). The improved Eq.(14) gives slightly higher positive $P_1$ than 1.1 kg/cm$^2$=2.1 atm, which confirms that the resin is immune from the defect at the coolest limit.

(2) Case 2 (Pressurizing Resin)

"U" denotes the volume of the transparent potting resin. "W" is the volume of the pressurizing resin. A hard outer shell enclosing the potting resin and the pressurizing resin can be deemed as a rigid body. The inner volume of the outer shell is determined to be 1. Then, U and W are normalized volumes of the potting resin and the pressurizing resin.

$$W+U=1. \quad (15)$$

The variation of the volume of the transparent potting resin is considered. "K" is the elastic modulus and $\alpha$ is the volume expansion coefficient. The volume change $\Delta U$ in a free state is $\Delta U=U_2\alpha(T-T_2)$, where $U_2$ is the volume of the resin at $T_2$. The volume change induced by a pressure variation is $-U_2(P-P_2)/K$. The total change of the volume of the potting resin is given by, $$\Delta U=U_2\alpha(T-T_2)-U_2(P-P_2)/K. \quad (16)$$

"2" means the parameters at the time of packaging under high pressure at a high temperature. The equations about the potting resin are similar to the case (1) of the pressurizing balloon. But the following are different from the case (1).

The pressurizing resin has an elastic coefficient "H" and a volume expansion coefficient "$\gamma$". A volume change of the pressurizing resin in a free state is $\Delta W=W_2\gamma(T-T_2)$, where $W_2$ is an initial volume at $T_2$. Another volume change of the resin under pressure P is $-W_2(P-P_2)/H$. Thus pressure P and a temperature T give the resin a volume change, $$\Delta W=W_2\gamma(T-T_2)-W_2(P-P_2)/H. \quad (17)$$

Eq.(15) restricts the volume changes of both the resins, $$\Delta U+\Delta W=0. \quad (18)$$

Substitution of Eq.(16) and Eq.(17) into Eq.(18) leads to, $$(U_2\alpha+W_2\gamma)(T_2-T)-(U_2/K+W_2/H)(P_2-P)=0. \quad (19)$$

The pressure P of the pressurizing resin and the potting resin follows Eq.(19) at any temperature. The pressure $P_1$ at the lowest temperature $T_1(-40°$ C.) is, $$\frac{P_2-P_1}{T_2-T_1}=\frac{(U_2\alpha+W_2\gamma)}{\left(\frac{U_2}{K}+\frac{W_2}{H}\right)}. \quad (20)$$

The initial pressure $P_2$ is given as pressure of transfermolding. $T_2$ is also given initially as the temperature of transfermolding. $T_2$ is, for example, 180° C.(453K). $T_1$ is the lowest temperature within the allowable range. Here $T_1=-40°$ C. $P_1$ is an unknown parameter which is the pressure of the resins at the coolest limit of $T_1=-40°$ C. Negative pressure (in Gauge unit) used to make the exfoliation, cracks and bubbles in the potting resin. The present invention advocates to raise the final pressure $P_1$ for avoiding exfoliation, cracks and bubbles. Enhancement of $P_1$ means to lower $(P_2-P_1)$.

A limit of $U_2=1$ and $W_2=0$ reduces the right-hand side of Eq.(20) to $\alpha K$. Another limit of $U_2=0$ and $W_2=1$ reduces the right-hand side of Eq.(20) to $\gamma H$. Since $U_2+W_2=1$, the right-hand side of Eq.(20) gives an intermediate value between $\alpha K$ and $\gamma H$ for intermediate $U_2$ and $W_2$. Eq.(20) is a weighed average between $\alpha K$ and $\gamma H$.

If the potting resin were not covered with the pressurizing resin, Eq.(16) would result in $\Delta U=0$, which would give the right-hand-side of Eq.(20)=$\alpha K$, since $W_2$ would be zero.

A $\gamma H$ smaller than $\alpha K$ allows Eq.(20) to reduce the pressure drop $(P_2-P_1)$ smaller than $\alpha K$. Namely, a brief restriction $$\gamma H<\alpha K \quad (21)$$

enables the modules to decrease the pressure drop $(P_2-P_1)$ far less than the conventional ones without pressurizing resin.

K is the volume elasticity of the potting resin and $\alpha$ is the volume thermal expansion coefficient of the same resin. H is the volume elasticity of the pressurizing resin and γ is the volume thermal expansion coefficient of the pressurizing resin. A choice of the potting resin and the pressurizing resin satisfying inequality (21) can prevent the dangerous, severe pressure fall at the lowest limit $T_1$. The smaller pressure drop $(P_2-P_1)$ accompanies the bigger $(\alpha K-\gamma H)$. A positive pressure $P_1$ in Gauge prohibits the defects from occurring. α, K, γ and H are definite parameters which are uniquely determined by the choice of the resins. The parameters cannot be freely varied when the resins are once determined.

Besides the four parameters depending upon the resins, there are extra adjustable parameters $U_2$ and $W_2$ which are ratios of the resins. Since $U_2+W_2=1$, the degree of freedom is increased only by one. The choice of $U_2$ ($W_2$) can adjust the reduction of the pressure $P_1$. The adjustablity is clarified by subtracting the right-hand side of Eq.(20) from αK.

$$\alpha K - \frac{(U_2\alpha + W_2\gamma)}{\left(\frac{U_2}{K} + \frac{W_2}{H}\right)} = \frac{W_2(\alpha K - \gamma H)}{H\left(\frac{U_2}{K} + \frac{W_2}{H}\right)} \quad (22)$$

The difference can be raised by either enhancing $(\alpha K-\gamma H)$ or increasing $W_2$. The pressurizing element enables this invention to suppress the pressure decline at the lowest limit $T_1$ and prohibit the potting resin from making exfoliation, cracks and bubbles.

[Embodiment 1 (Side Pressurizing Balloons; LD or Front End Incidence Type PD; FIGS. 14–18)]

Embodiment 1 is an application to an LD module with an LD or a PLC type PD module with a front end incidence type PD. To avoid redundancy, the following relates only to an improvement of a PD module. But an LD module can be obtained solely by replacing the PD by an LD in the figures. Front end incidence type PDs are not prevalent yet. But the front end PD has an apparently simpler structure than other type PDs. An application to the PD facilitates understanding of the present invention.

Figure 14:
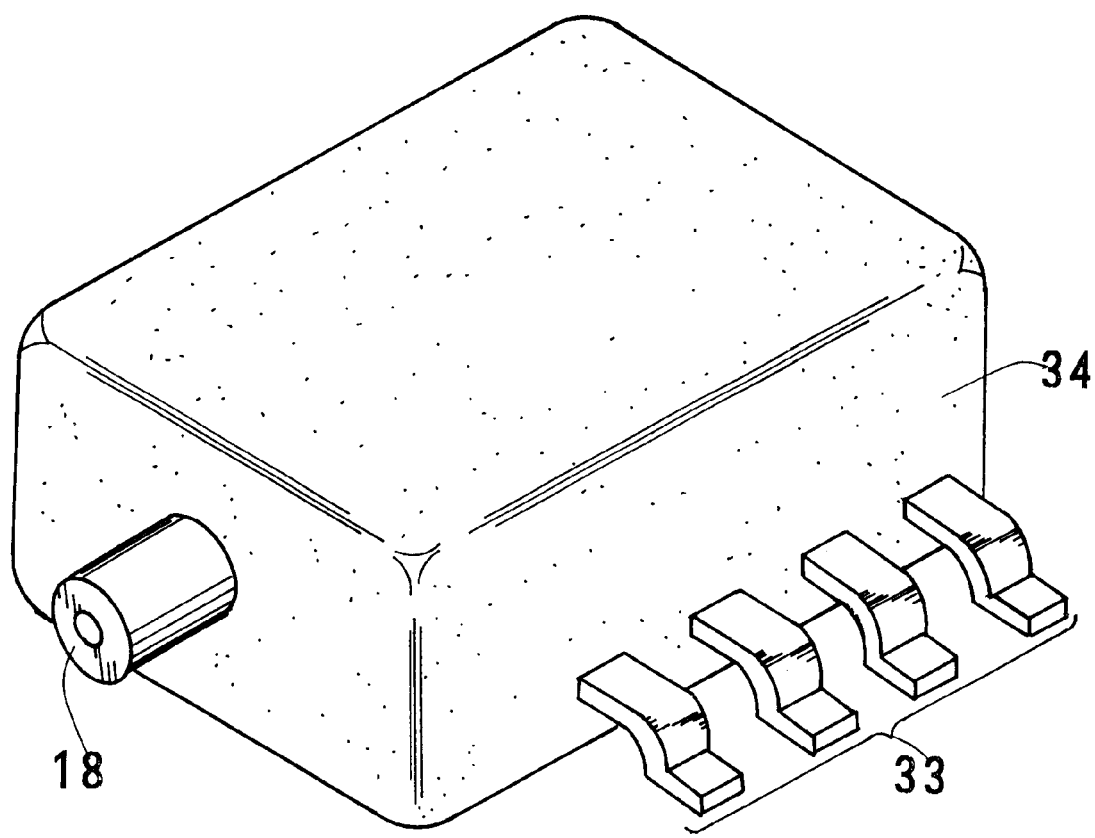
FIG. 14 is a perspective view showing the appearance of the completed PD module or the LD module.

FIG. 14 shows an appearance of the completed PD module of Embodiment 1. The PLC type PD module is encapsulated in a plastic molding package of epoxy resin 34. The epoxy resin 34 is endowed with moldability. The epoxy molding makes rigid, waterproof, airtight and inexpensive packages. The PD module has an optical fiber or a ferrule 18 for coupling to an optical connector (not shown) at an end. Lead pins 33 extend from sides of package 34 for electrical connection with an outer electrical circuit (not shown).

Simplicity characterizes the PLC (planar lightguide circuit). Embodiment 1 has a box-shaped appearance for simplifying the description of the present invention. Other shapes are also available to the completed PD module. A leadframe or leadpins for electrical connection are omitted in the following description for avoiding obscuring the gist of the invention.

FIG. 15 and FIG. 16 are plan and section views of a PLC type PD module of Embodiment 1 at a step on fabrication. A rectangular silicon (Si) bench 12 has a front upper step 13 and a rear lower step 14. A bigger V-groove 16 and a smaller V-groove 17 are dug along a central line on the front upper step 13 like the prior art of FIG. 2 to FIG. 5. Several metallized patterns (wirings and pads; not shown) are printed upon the Si bench 12. An AuSn (gold/tin) solder fixes a front end incidence type PD 15 (or LD for an LD module) on a metallized pad of the rear lower step 14. A ferrule 18 with a fiber 19 is inserted and glued into the V-grooves 16 and 17 with an adhesive. A top electrode of the PD is wirebonded to another metallized pad.

The silicon bench 12 is mounted upon a leadframe (not shown) with leadpins. The metallized patterns are electrically connected to the leadpins by wirebonding.

Pressurizing balloons 40 and 41 which are, e.g., rubber balloons dilated with nitrogen gas are laid on both sides of the silicon bench 12. The expanded pressurizing balloons 40 and 41 are tentatively stuck to the symmetric side spots of the Si bench 12 with a resin adhesive.

The space including the gap between the fiber end and the PD (or LD) chip 15 is covered with a transparent silicone-type resin or a transparent acrylate-type resin 24 having a refractive index similar to the fiber in a fluid state, which step is called "potting" or "resin-potting". The potting resin 24 is hardened by heating or ultraviolet ray irradiation in accordance with the resin property. The resin which is hardened by heating is called a thermosetting resin. The resin which hardened by irradiating with ultraviolet rays is called a UV-setting resin. The transparent potting resin keeps some elasticity after the hardening step. Without elasticity, the pressurizing balloons would fail to distort the potting resin 24. The section of the object is shown in FIG. 16.

The whole object is transfer-molded with the epoxy resin 34 in a metallic mold which is heated and pressurized. The epoxy resin 34 encloses and coats the silicon bench 12, the fiber, the ferrule 18, the potting resin 24, the PD 15 and the leadframe. At the molding step, the inner pressurizing balloons 40 and 41 are shrunk to the smallest volume by the pressure of the transfer-molding. The pressurizing balloons 40 and 41 are encased in the excess shrunk state in the outer hard shell 34. The thermosetting epoxy resin has a shape determined after the metallic mold. The outer epoxy resin forms a plastic mold package 34, which is shown in FIG. 14. The outer hard shell can be deemed as a rigid body due to very high elastic coefficient. The balloons 40 and 41 are tight contact with the inner potting resin 24 being softer than the outer shell 34. Interfaces between the pressurizing balloons 40 and 41 and the potting resin 24 are not static but are moved outward or inward by changes of the pressure and the temperature owing to the differences of the compressibility and thermal expansion between them.

Figure 17:
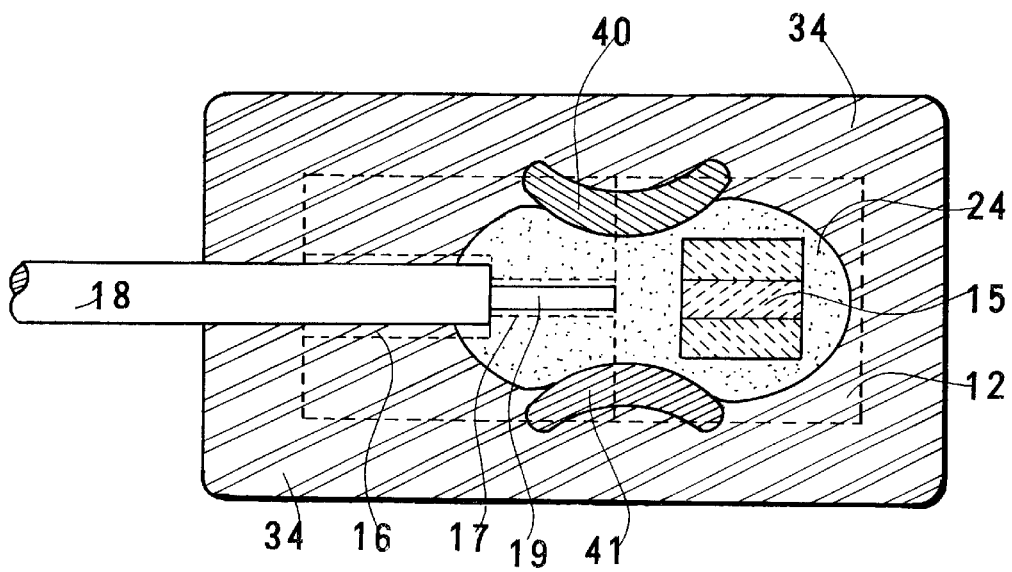
FIG. 17 a horizontally-sectioned view of the PD module of Embodiment 1 which has a PD, a fiber, a transparent potting resin between the fiber and the PD chip and pressurizing balloons being posed upon the sides of the potting resin for inhibiting the resin from generating the exfoliation, the cracks and the bubbles by giving extra pressure to the resin in the state of the pressurizing balloons strongly compressed by the potting resin and outer hard resin package at room temperature.

The pressurizing balloons are still in a shrunk state by the outer pressure of the potting resin at room temperature (FIG. 17). The inner volume determined by the outer shell is deemed to be constant irrespective of the temperature variations. When the PD module is cooled below room temperature, the inner potting resin 24 decreases further its volume. The middle pressurizing balloons 40 and 41 expand themselves for compensating the reduction of volume induced by the potting resin 24.

Figure 18:
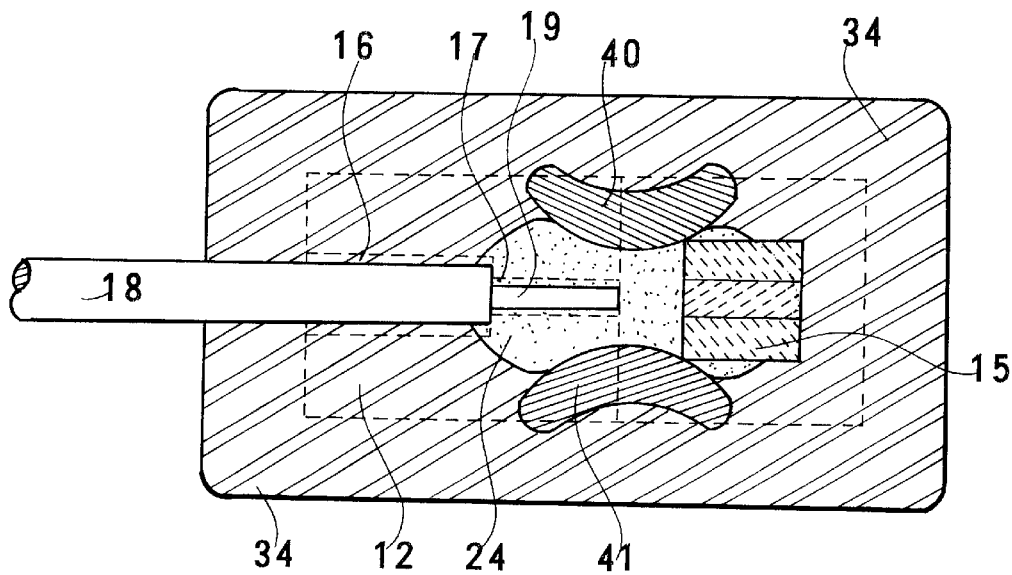
FIG. 18 a horizontally-sectioned view of the same PD module of Embodiment 1 as FIG. 17 which has a PD, a fiber, a transparent potting resin between the fiber and the PD chip and pressurizing balloons being posed upon the sides of the potting resin for inhibiting the resin from generating the exfoliation, the cracks and the bubbles by giving extra pressure to the resin in the state of the pressurizing balloons mildly compressed by the potting resin and the outer hard resin package at a low temperature near −40° C.

The balloons 40 and 41 expand inward for pressing the sides of the potting resin 24 as shown in FIG. 18. At the lowest limit (−40° C.) of temperature, the pressuring balloons take the largest volume and give positive pressure to the inner potting resin 24. It may be surprising that the coolest state gives the largest volume to the pressurizing balloons. The phenomenon would be contradictory to the common sense of the skilled. But the reason has been already mentioned in the preceding chapters. The transparent potting resin is still compressed by the balloons 40 and 41. The residual positive pressure of the balloons inhibits the potting resin from making the exfoliation (A), the cracks (C) and the air bubbles (B).

The sensitivity of the PD module after the heat cycle test is examined. All the samples of Embodiment 1 reveal good temperature property of Sample A (○) in FIG. 6. The modules of Embodiment 1 are immune from the defect of the fall of sensitivity at a low temperature. It is also confirmed that all the LD modules of Embodiment 1 are free from the problems of the increase of the reflection, the kinks in the current/power relation and the multi-peaks in the spectrum.

Figure 19:
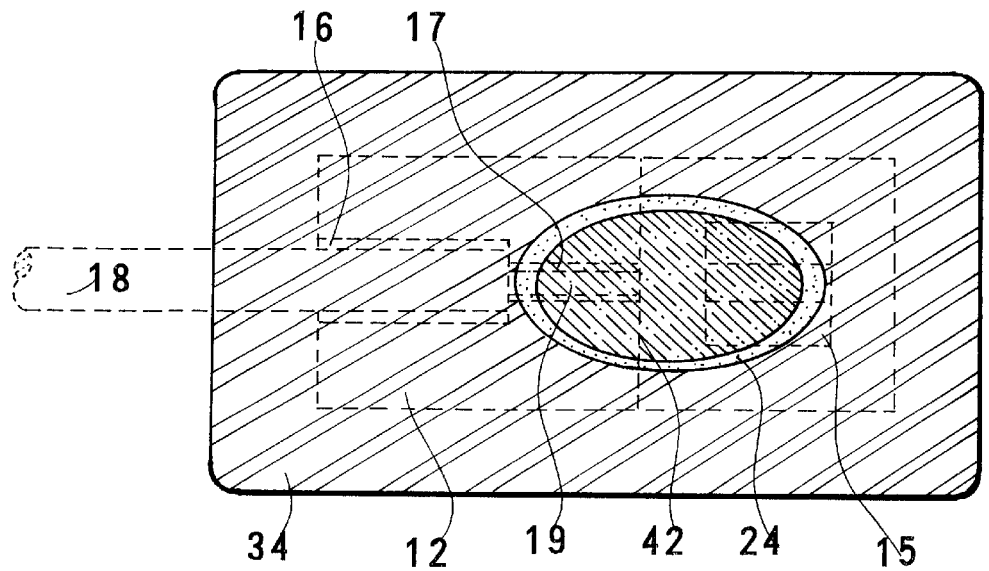
FIG. 19 a horizontally-sectioned view of a PD module of Embodiment 2 which has a PD, a fiber, a transparent potting resin between the fiber and the PD chip and a pressurizing balloon being posed upon the top of the potting resin for inhibiting the resin from generating the exfoliation, the cracks and the bubbles by giving extra pressure to the resin.
Figure 20:
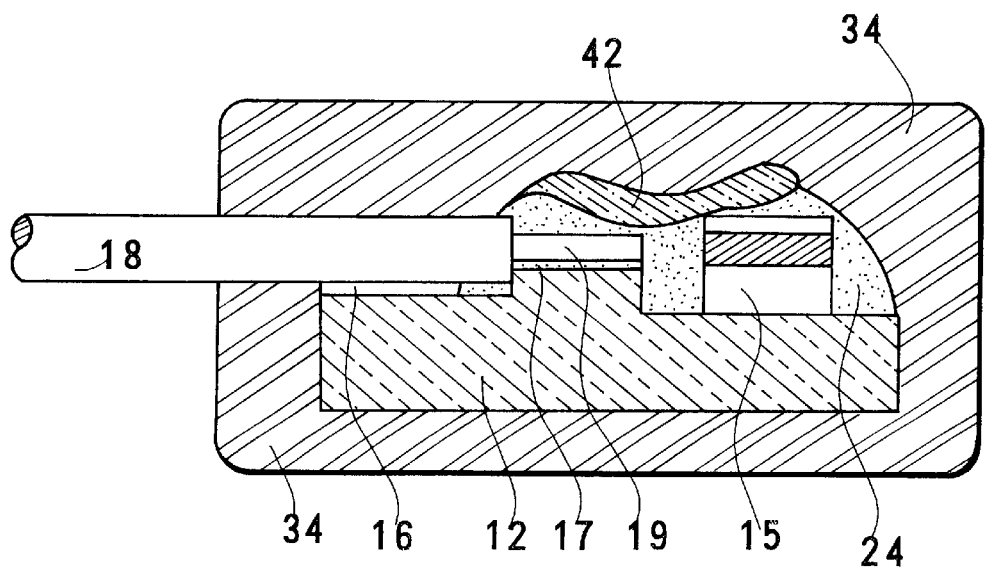
FIG. 20 a vertically-sectioned view of the same PD module of Embodiment 2 as FIG. 19 which has a PD, a fiber, a transparent potting resin between the fiber and the PD chip and a pressurizing balloon being posed upon the top of the potting resin for inhibiting the resin from generating the exfoliation, the cracks and the bubbles by giving extra pressure to the resin.

[Embodiment 2 (Top Pressurizing Balloon; LD or Front End Incidence Type PD; FIGS. 19–20)]

Embodiment 2 is also an application to an LD module with an LD or a PLC type PD module with a front end incidence type PD. The following description can be applied to an LD module by replacing the PD by an LD like Embodiment 1. The position of the pressurizing balloon is not restricted to the sides of the potting resin. The position and the number of the pressurizing balloons should be changed in accordance with the disposition of the optical parts and the fiber. Embodiment 2 lays one balloon on the top of the transparent resin.

In FIG. 19 and FIG. 20, a front end incidence type PD 15 is mounted under a guidance of positioning marks upon a lower back step of a silicon bench 12 having a bigger V-groove 16 and a smaller V-groove 17 on a front upper step and metallized patterns on the rear step. A ferrule 18 is fitted in the larger V-groove 16 and a fiber 19 is fixed in the smaller V-groove 17 by an adhesive. A top electrode of the PD 15 is wirebonded to one pad of the metallized patterns. The Si bench 12 is fitted upon a leadframe (not shown in the figures). Leadpins of the leadframe are connected to the metallized wiring pattern by wirebonding. The end of the fiber 19 and the PD 15 are potted with a transparent resin (silicone-type resin or acrylate-type resin) 24. A single pressurizing balloon 42 is laid upon the top of the transparent potting resin 24. Embodiment 2 differs from Embodiment 1 only in this respect.

The whole of the Si-bench 12, the lead frame and the ferrule 18 is transfermolded with epoxy resin 34 at high pressure. The transfermolding applies strong pressure to the top balloon 42. The balloon 42 is encapsulated in a shrunk state under the high pressure in the hard epoxy resin shell 34. The role of the compressed balloon 42 is a pressure source.

When the module is cooled, the potting 24 resin shrinks. The balloon 42 presses the potting resin at a low temperature. The resin keeps positive pressure due to the balloon 42. The positive pressure enables the potting resin to prohibit the exfoliation, cracks or bubbles from occurring.

Figure 21:
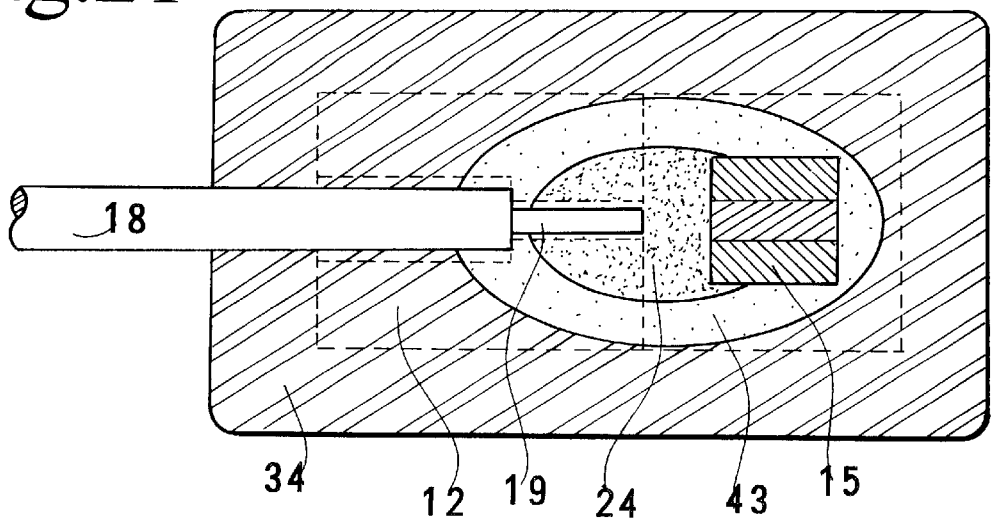
FIG. 21 a horizontally-sectioned view of a PD module of Embodiment 3 which has a PD, a fiber, a transparent potting resin between the fiber and the PD chip and a pressurizing resin layer covering the top of the potting resin for inhibiting the resin from generating the exfoliation, the cracks and the bubbles by giving extra pressure to the resin.
Figure 22:
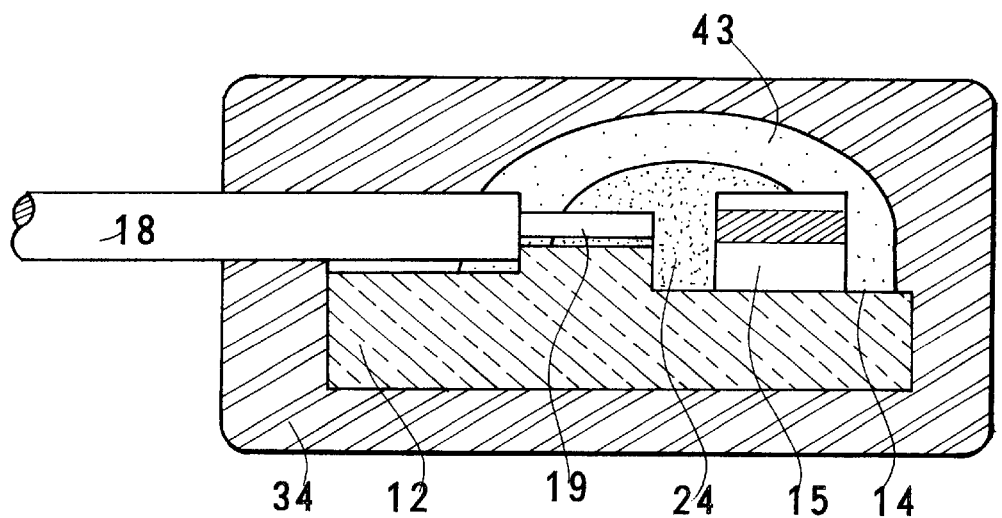
FIG. 22 a vertically-sectioned view of the same PD module of Embodiment 3 as FIG. 21 which has a PD, a fiber, a transparent potting resin between the fiber and the PD chip and a pressurizing resin layer covering the top of the potting resin for inhibiting the resin from generating the exfoliation, the cracks and the bubbles by giving extra pressure to the resin.

[Embodiment 3 (Pressurizing Resin Encasing the Potting Resin; LD or Front End Incidence Type PD; FIGS. 21–22)]

The pressurizing element is not restricted to the balloon. An alternative is a soft resin which makes the best use of its intrinsic elasticity for pressurizing the potting resin instead of the compressed gas in the balloon. The embedded rubber balloons may sometimes be broken in the sealed package by the longtime degeneration. Even if the balloons were broken, the extra pressure would be maintained in the package due to the airtight sealing of the epoxy resin. However, if the longtime degradation happened on the outer shell, the gas leakage would deprive the PD or LD module of the extra pressure. The pressurizing resin has an advantage of higher aging-resistance than the pressurizing balloon.

FIG. 21 and FIG. 22 denote a PD module or an LD module of Embodiment 3. Here an application to a PD module is described. A rectangular silicon bench 12 has a PD 15, a fiber 19 and a ferrule 18 along a central line. A transparent potting resin 24 covers the intermediate space between the PD 15 and the fiber 19. The potting resin 24 is an acrylate-type resin or a silicone-type resin with a refractive index similar to the fiber. The potting resin 24 is embraced by a pressurizing resin 43 having a smaller volume expansion coefficient ($\gamma$) than the potting resin 24 ($\alpha$). More rigorous condition is expressed by an inequality $\alpha K > \gamma H$, where K is the elastic coefficient of the potting resin 24 and H is the elastic coefficient of the pressurizing resin 43.

FIG. 22 shows the pressurizing resin 43 touching the Si bench 12 and encasing the potting resin 24. The outer epoxy resin 34 encloses the silicon bench 12, the intermediate pressurizing resin 43 and the ferrule 18. The module has three resin layered structure.

The outer epoxy resin 34 having a linear expansion coefficient of about $10^{-5}/°$ C. can be deemed as a rigid vessel which does not change the volume by a change of temperature. Here, a silicone-type resin (having the highest linear expansion coefficient of $2 \sim 3 \times 10^{-4}/°$ C.) is employed as the transparent potting resin 24. An acrylate-type resin (having a medium linear expansion coefficient of $5 \times 10^{-5}/°$ C.) is chosen as the pressurizing resin 43. The transfermolding endows extra pressure to both the potting resin 24 and the pressurizing resin 43. A fall of temperature reduces the volume of the innermost potting resin 24. To the contrary, the intermediate pressurizing resin 43 expands for compensating the reduction of the volume and for applying positive pressure to the potting resin 24. Neither the exfoliation, the cracks nor the bubbles happen in the potting resin 24.

Figure 23:
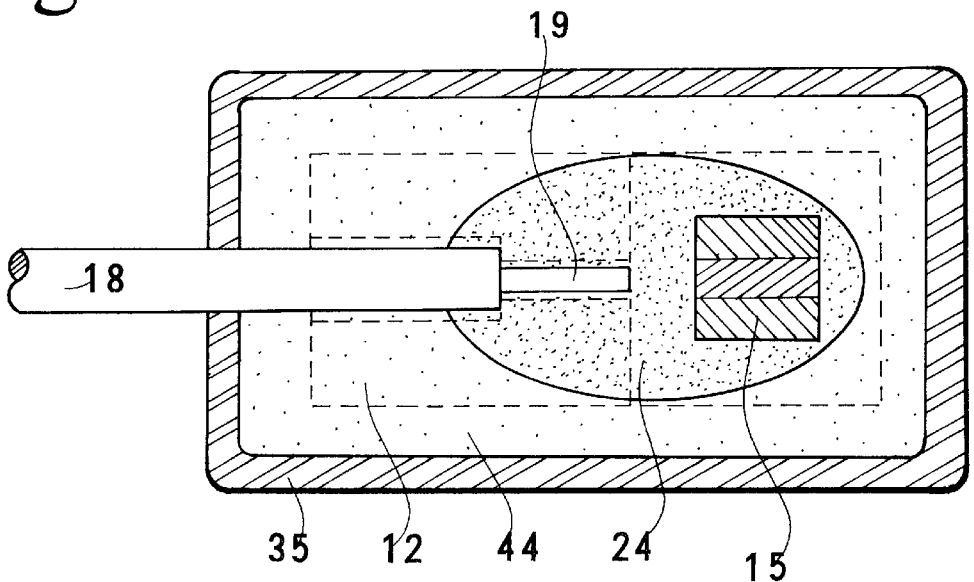
FIG. 23 a horizontally-sectioned view of a PD module of Embodiment 4 which has a PD, a fiber, a transparent potting resin between the fiber and the PD chip, a pressurizing resin layer covering the top of the potting resin for inhibiting the resin from generating the exfoliation, the cracks and the bubbles by giving extra pressure to the resin and a box package enclosing the pressurizing resin layer.
Figure 24:
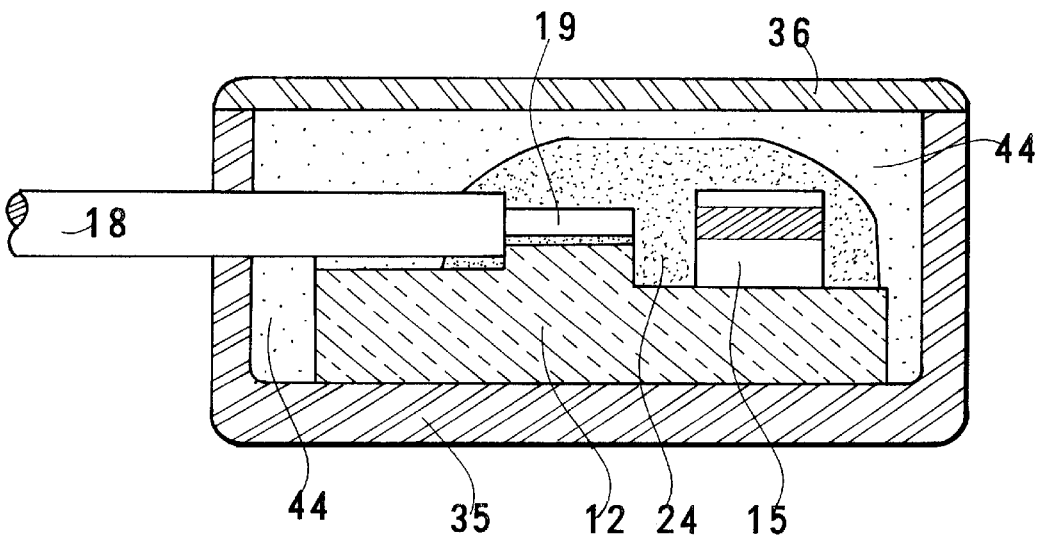
FIG. 24 a vertically-sectioned view of the same PD module of Embodiment 4 as FIG. 23 which has a PD, a fiber, a transparent potting resin between the fiber and the PD chip, a pressurizing resin layer covering the top of the potting resin for inhibiting the resin from generating the exfoliation, the cracks and the bubbles by giving extra pressure to the resin and a box package enclosing the pressurizing resin layer.

[Embodiment 4 (Pressurizing Resin Encapsulating Si Substrate; LD or Front End Incidence Type PD; FIGS. 23–24)]

Embodiment 4 enlarges the range being encapsulated by the pressuring resin and encloses the Si bench by a ready-made box-shaped package which is made either from metals or from plastics.

Like the preceding embodiments, a silicon bench 12 maintains a fiber 19, a ferrule 18 and a PD 15 along a central line on the top surface. The Si bench 12 is inserted into a prepared box package 35 having a metallized wiring pattern. The electrode of the PD 15 is connected by wirebonding to the wiring pattern of the package.

A transparent resin 24 is potted on the Si-bench 12 for filling the gap between the fiber end and the PD 15. The transparent resin 24 is still soft after hardening. A pressurizing resin in a fluid state is supplied into a package 35 up to a full level. The package 35 is closed and sealed by a cap 36 under excess pressure. The inner potting resin 24 and the intermediate pressurizing resin 44 contain the extra pressure. When the module is cooled down to the lowest limit, the resins 24 and 44 maintain positive pressure. The positive pressure forbids the resin 24 making exfoliation, cracks or bubbles. Since Embodiment 4 contains the pressurizing resin far more than the potting resin in volume, the residual pressure applied to the potting resin is larger than Embodiment 3 at a low temperature.

Figure 25:
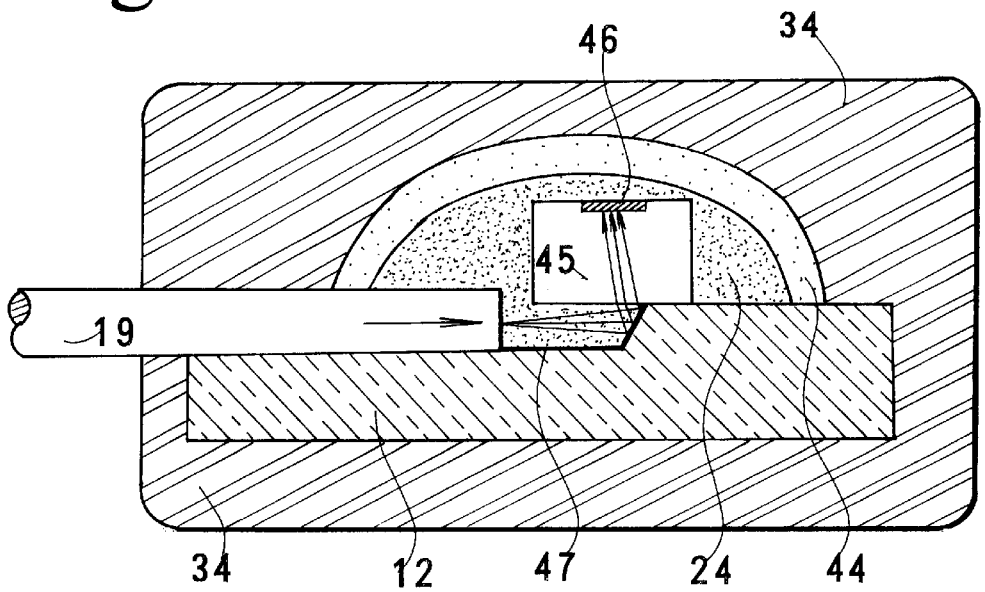
FIG. 25 a vertically-sectioned view of a PD module of Embodiment 5 which has a bottom incidence-type PD, a fiber, a transparent potting resin filling the gap between the fiber and the PD chip, a pressurizing resin layer covering the top of the potting resin for inhibiting the resin from generating the exfoliation, the cracks and the bubbles by giving extra pressure to the resin and a plastic moulding package enclosing the pressurizing resin layer.

[Embodiment 5 (Bottom Incidence Type PD; FIG. 25)]

All the preceding embodiments relate to improvements of modules of front end incidence type PDs or LDs for the sake of simplifying the description. This invention can be also applied to other types of optoelectronic modules or parts.

FIG. 25 shows Embodiment 5 of a PD module including a bottom-incidence type PD. Bottom incidence type PDs are more popular than front end incidence type PDs. The bottom incidence type PD requires more complex optical paths. A silicon bench (substrate) 12 has metallized wiring patterns made by evaporation or sputtering, a V-groove 47 and an end mirror which are fabricated by anisotropic etching. A fiber 19 is embedded in the V-groove 47. A bottom-incidence type PD 45 with a light sensing region 46 upward is fixed at the end of the V-groove 47 above the slanting end mirror on the Si bench 12. The PD electrodes are connected to the metallized pattern by wires. The end of the fiber 19, the V-groove 47 and the PD 45 are encompassed by a transparent potting resin 24 of a refractive index akin to the fiber. A pressurizing element 44 (resin or balloon) encapsulates the potting resin 24. FIG. 25 denotes an example of a pressurizing resin 44. The Si bench 12 is stuck upon a leadframe (not shown). The metallized patterns are connected to the leadpins with wires.

Under excess pressure, the whole is transfermolded in a metallic mould with epoxy resin 34. The hardened epoxy resin 34 forms an outer shell with a constant inner volume. The pressurizing resin 44 applies strong pressure to the potting resin 24 at room temperature. The potting resin shrinks at a low temperature but the pressurizing resin compensates the reduction of the volume by dilating itself. Even at the lowest temperature limit, the pressurizing resin compresses the potting resin with positive pressure. The positive pressure prohibits the exfoliation, the cracks or the bubbles from occurring in the potting resin 24. Embodiment 5 has more complex optical paths than the preceding embodiments. Then the effect of the pressurizing resin would reveal more conspicuously.

Figure 26:
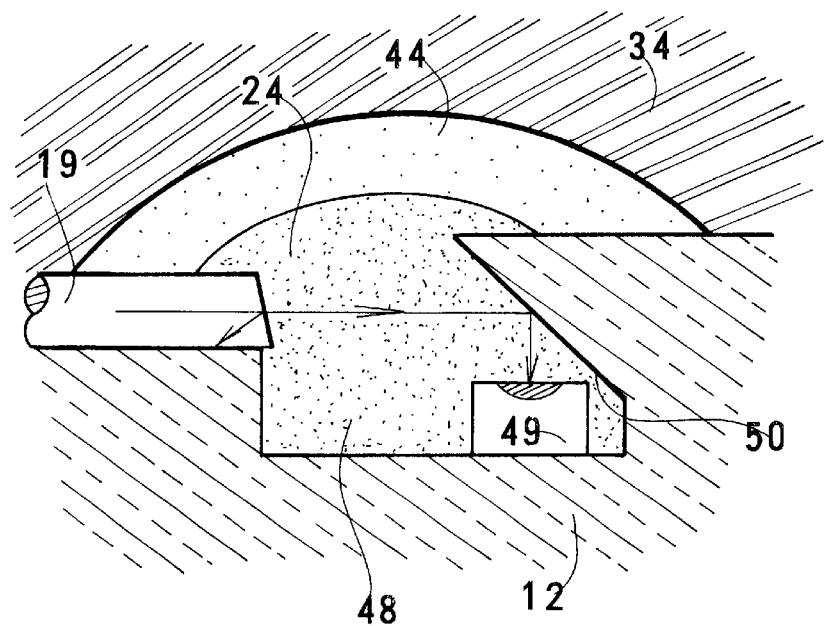
FIG. 26 a vertically-sectioned view of a part of a PD module of Embodiment 6 which has a top-incidence type PD, a fiber, a transparent potting resin filling the gap between the fiber and the PD chip, a pressurizing resin layer covering the top of the potting resin for inhibiting the resin from generating the exfoliation, the cracks and the bubbles by giving extra pressure to the resin and a plastic moulding package enclosing the pressurizing resin layer.

[Embodiment 6 (Top Incidence Type PD; FIG. 26)]

FIG. 26 shows an application to a top incidence type PD. A silicon bench 12 having a V-groove and a cavity 48 is prepared. The cavity 48 has end. A top incidence type PD 49 is mounted on a bottom of the cavity 48. A fiber 19 is imbedded in the V-groove on the Si bench 12. A transparent potting resin 24 is filled in the cavity 48 for covering all the light paths. A pressurizing resin 44 or balloon is supplied upon the potting resin 24. Then, transfermolding makes an epoxy resin package 34 under excess pressure. Compressive stress remains in the resin 44. At a low temperature, the residual compressive stress prevents the potting resin from making the exfoliation, the cracks or the bubbles. The light emitted from the fiber 19 is reflected at the inner slanting wall and is guided to a top of the PD 49.

Figure 27:
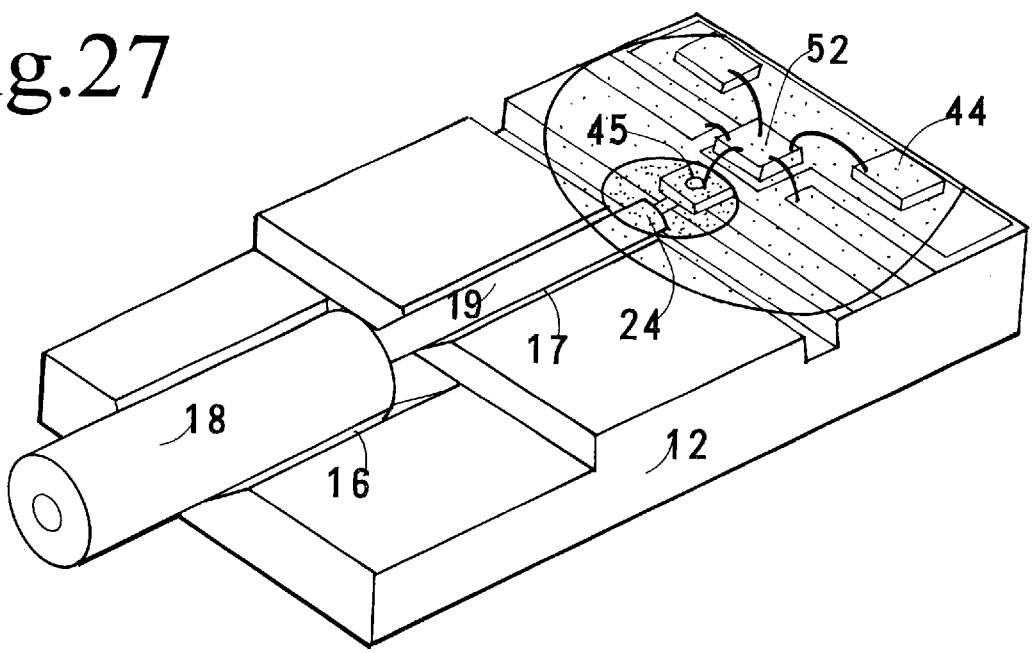
FIG. 27 a perspective view of a PD module of Embodiment 7 before packaging which has a bottom-incidence type PD, a fiber, an AMP, a transparent potting resin filling the gap between the fiber and the PD chip, a pressurizing resin layer covering the top of the potting resin for inhibiting the resin from generating the exfoliation, the cracks and the bubbles by giving extra pressure to the resin.

[Embodiment 7 (Bottom Incidence Type PD+AMP; FIG. 27)]

FIG. 27 shows Embodiment 7 which is an application to the PD+AMP module having a preamplifier AMP for amplifying weak signal. A larger V-groove 16 and a smaller V-groove 17 are shaped along an axial line on a silicon bench 12. A tiny V-groove is also formed for guiding the light from the fiber. Metallized patterns are made on the silicon bench 12. A fiber 19 and a ferrule 18 are fitted upon the V-grooves 16 and 17. A bottom incidence type PD 45 is mounted at the end of the tiny groove. An AMP 52 (amplifier) is mounted upon the Si bench at the back of the PD 45. The electrodes of the PD 45 and the AMP 52 are wirebonded to the metallized wiring patterns. A transparent resin 24 is supplied to the small region between the fiber 19 and the PD. A pressurizing element 44 (resin or balloon) covers the potting resin 24. The Si bench 12 is fitted upon a leadframe (not shown). The metallized patterns are connected to leadpins by wires. The object of FIG. 27 is transfermolded with epoxy resin under high pressure. A completed PD module as shown in FIG. 14 is obtained. In the PD module, the pressurizing resin prohibits the resin from producing the exfoliation, the cracks or the air bubbles at a low temperature.

Figure 28:
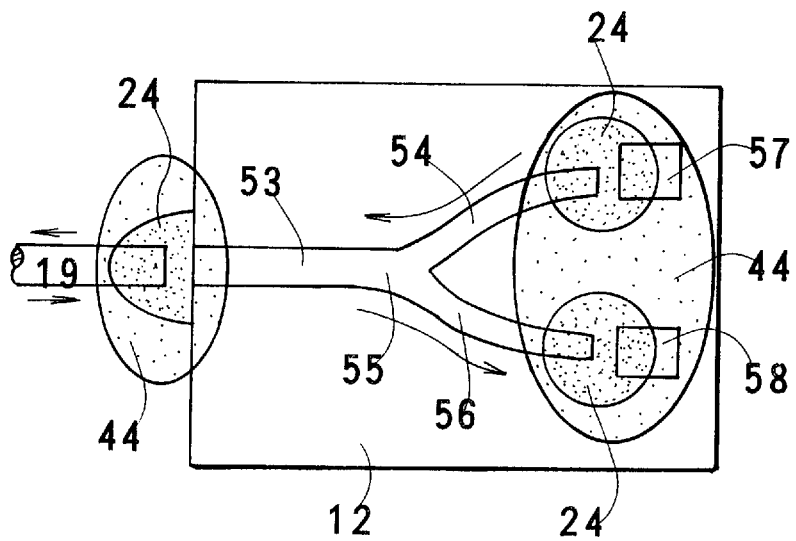
FIG. 28 a plan view of an LD/PD module of Embodiment 8 before packaging which has a front-incidence PD, an LD, a fiber, waveguides, a transparent potting resin filling the gaps between the fiber and the waveguide and between the waveguides and the LD/PD, pressurizing resin layers covering the top of the potting resin layers for inhibiting the resin from generating the exfoliation, the cracks and the bubbles by giving extra pressure to the resin layers.

[Embodiment 8; LD/PD Module; Light Waveguides; FIG. 28)]

FIG. 28 shows Embodiment 8 of an LD/PD module having light waveguides. A silicon substrate 12 has Y-branched light waveguides 53, 54, 55 and 56 which is produced by making a SiO$_2$ layer on the Si substrate by sputtering, piling a Ge-doped SiO$_2$ waveguide on the SiO$_2$ layer, eliminating the Ge-doped SiO$_2$ layer except light paths by photolithography. An LD 57 is mounted at an end of the waveguide 54 on the Si substrate 12. An PD 58 is mounted at an end of the waveguide 56. A WDM filter is formed at the confluence 55 of the waveguides. A fiber 19 is glued to the front end of the waveguide 53. Transparent potting resin layers 24 cover a first joint between the waveguide 54 and the LD 57, a second joint between the waveguide 56 and the PD 58 and a third joint between the fiber 19 and the waveguide 53. Pressurizing elements 44 (resin or balloon) are supplied upon the potting resin layers 24. The Si bench 12 is laid upon a leadframe. The metallized patterns are connected to the leadpins (not shown). The Si bench with the leadframe is transfermolded in a metallic mould with fluid epoxy resin under extra pressure. The pressurizing element 44 prohibits the potting resin from making the exfoliation, cracks and bubbles at a low temperature.

Figure 29:
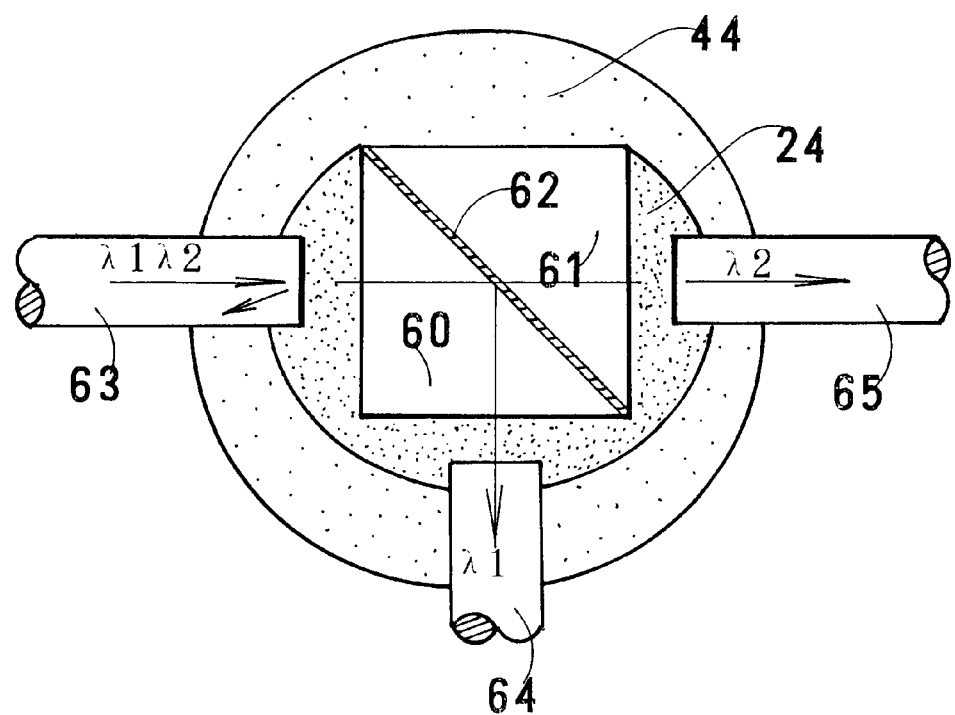
FIG. 29 a horizontally-sectioned view of an WDM filter of Embodiment 9 which has three fibers, a WDM glass block including a dielectric multilayer film, a transparent potting resin layer filling the gaps among the fibers and the WDM glass block, a pressurizing resin layer covering the top of the potting resin layer for inhibiting the resin from generating the exfoliation, the cracks and the bubbles by giving extra pressure to the resin layers.

[Embodiment 9 (Beam Splitter; FIG. 29)]

FIG. 29 shows Embodiment 9 which is an application to a wavelength division beam splitter. The beam splitter has two triangle glass blocks 60 and 61 and a dielectric multilayer film 62 sandwiched between the triangle glass blocks 60 and 61. Three fibers 63, 64 and 65 are joined to three surfaces of the glass blocks. The fiber 63 emits signal light of wavelengths $\lambda 1$ and $\lambda 2$. The wavelength $\lambda 1$ light is reflected by the multilayer film 62 toward the fiber 64. The wavelength $\lambda 2$ light passes the multilayer film 62 and goes into the fiber 65.

Transparent potting resin layer 24 covers the joints among the glass block and the fibers for decreasing the reflection loss. The transparent potting resin 24 is also encapsulated by a pressurizing resin layer 44. The resin 44 is further encased in a harder resin, e.g., epoxy resin under high pressure. Inherent extra pressure maintained by the pressurizing resin 44 prohibits the resin from making the cracks, the exfoliation and bubbles at a low temperature.

[Embodiment 10 (LD Module; LD+Monitoring PD; FIGS. 30–31)]

FIG. 30 and FIG. 31 show Embodiment 10 which is an application of the present invention to an LD module with a monitoring PD. A Si bench 12 has a larger V-groove 16, a smaller V-groove 17 and a path-conversion groove 70 in series along a central line. A ferrule 18 and a fiber 19 are embedded into the larger V-groove 16 and the smaller V-groove 17. An LD 71 is epi-down laid upon the Si substrate 12 at an extension of the fiber 19. The LD 71 produces sending signal light which goes into the fiber and propagates to a counterpart unit. A monitoring PD 72 is fitted upon the Si substrate 12 at an end of the path-conversion groove 70 for monitoring the output power of the LD.

The path-conversion groove 70 has the role of reflecting the light emanating from the rear end of the LD toward the PD 72. A transparent resin 24 is supplied to a space including the fiber end, the path-conversion groove 70, the LD 71 and the PD 72 for reducing reflected light. The transparent potting resin 24 is encased by a pressurizing element 44 (pressurizing resin or pressurizing balloon). Under the condition of applying excess pressure, the whole of the silicon substrate of FIG. 31 is transfermolded with epoxy resin or is encased in a ready-made box package. The intrinsic compressive stress originating from the pressurizing element 44 forbids the potting resin to generate the exfoliation, the cracks and the bubbles.

What is claimed is:

1. An optical communication device comprising:
   a plurality of optical parts being aligned along an optical axis for exchanging signal light between them;
   a transparent potting resin having a refractive index akin to one of the optical parts for filling a gap between the optical parts;

a pressurizing element with extra pressure in contact with the transparent potting resin for applying positive pressure upon the transparent potting resin within a predetermined range of temperature; and a rigid package encapsulating the optical parts, the transparent potting resin and the pressurizing element on a condition of giving excess pressure to the pressuring element.

2. The optical communication device according to claim 1, wherein the pressurizing element is pressurizing balloons containing gas and at least one pressurizing balloon is positioned upon the transparent potting resin and is sealed in the package in a shrunk state for maintaining extra pressure.

3. The optical communication device according to claim 2, wherein the pressurizing balloon consists of a closed elastic membrane and a gas sealed in the membrane and the sealed gas is air, nitrogen gas, argon gas or other rare gas.

4. The optical communication device according to claim 3, wherein two pressurizing balloons press sides of the potting resin on both sides of the optical axis.

5. The optical communication device according to claim 3, wherein one pressurizing balloon presses a top of the potting resin just on the optical axis.

6. The optical communication device according to claim 1, wherein the package is a resin-molding package produced by resin molding in a metallic mold by supplying a fluid resin, the pressurizing element is a pressurizing resin having a product of thermal expansion coefficient and volume elasticity modulus smaller than the transparent potting resin, the pressurizing resin covers the transparent potting resin and the pressurizing resin is sealed in the resin molding package in a compressed state for maintaining extra pressure.

7. The optical communication device according to claim 6, wherein the transparent potting resin is a silicone-type resin and the pressurizing resin is an acrylate-type resin.

8. The optical communication device according to claim 1, wherein the package is a ready-made package having a definite shape, the pressurizing element is a pressurizing resin having a product of thermal expansion coefficient and volume elasticity modulus smaller than the transparent potting resin, the pressurizing resin covers the transparent potting resin and the pressurizing resin is sealed in the package in a compressed state for maintaining extra pressure.

9. The optical communication device according to claim 8, wherein the transparent potting resin is a silicone-type resin and the pressurizing resin is an acrylate-type resin.

10. The optical communication device according to claim 1, wherein one of the optical parts is either an optical fiber or a light waveguide and the other is a light emitting device, a photodetecting device, a filter, a prism, a mirror or an assembly of a light emitting device, a photodetecting device, a filter, a prism or a mirror.

11. The optical communication device according to claim 1, wherein the transparent potting resin is a silicone-type resin.

12. The optical communication device according to claim 1, wherein the optical parts are fixed along the optical axis upon a silicon bench with metallized wiring patterns.

13. The optical communication device according to claim 12, wherein the silicon bench is fitted upon a leadframe with leadpins and the metallized wiring patterns are electrically connected to the leadpins by wirebonding.

14. The optical communication device according to claim 13, wherein one of the optical parts is an optical fiber encased in a ferrule and the silicon bench has a larger V-groove and a smaller V-groove along the optical axis for supporting the ferrule and the fiber.

15. The optical communication device according to claim 14, wherein the other optical part is a front end incidence type PD, the silicon bench has a front step and a rear step, the larger V-groove and the smaller V-groove are formed on the front step, the front end incidence type PD is mounted at an extension of the fiber on the rear step of the silicon bench, and the transparent potting resin covers the fiber end, the PD and a part of the silicon bench at the gap between the fiber and the PD.

16. The optical communication device according to claim 15, wherein the pressurizing element is two pressurizing balloons which are in contact with both sides of the potting resin, and the two pressurizing balloons are stored in a compressed state in an epoxy resin molding package which is formed by transfermolding with a fluid epoxy resin in a metallic mould under excess pressure at a high temperature.

17. The optical communication device according to claim 15, wherein the pressurizing element is one pressurizing balloon which is in contact with a top of the potting resin, and the pressurizing balloon is stored in a compressed state in an epoxy resin molding package which is formed by transfermolding with a fluid epoxy resin in a metallic mould under excess pressure at a high temperature.

18. The optical communication device according to claim 15, wherein the pressurizing element is a pressurizing resin which covers the potting resin and is in contact with the silicon bench.

19. The optical communication device according to claim 18, wherein the pressurizing resin is stored in a compressed state in an epoxy resin molding package which is formed by transfermolding with a fluid epoxy resin in a metallic mould under excess pressure at a high temperature.

20. The optical communication device according to claim 18, wherein the pressurizing resin is stored in a compressed state in a ready-made package having a definite shape under excess pressure.

21. The optical communication device according to claim 14, wherein the other optical part is an LD, the silicon bench has a front step and a rear step, the larger V-groove and a smaller V-groove are formed on the front step, the LD is mounted at an extension of the fiber on the rear step of the silicon bench, and the transparent potting resin covers the fiber end, the LD and a part of the silicon bench at the gap between the fiber and the LD.

22. The optical communication device according to claim 21, wherein the pressurizing element is two pressurizing balloons which are in contact with both sides of the potting resin, and the two pressurizing balloons are stored in a compressed state in an epoxy resin molding package which is formed by transfermolding with a fluid epoxy resin in a metallic mould under excess pressure at a high temperature.

23. The optical communication device according to claim 21, wherein the pressurizing element is one pressurizing balloon which is in contact with a top of the potting resin, and the pressurizing balloon is stored in a compressed state in an epoxy resin molding package which is formed by transfermolding with a fluid epoxy resin in a metallic mould under excess pressure at a high temperature.

24. The optical communication device according to claim 21, wherein the pressurizing element is a pressurizing resin which covers the potting resin and is in contact with the silicon bench.

25. The optical communication device according to claim 24, wherein the pressurizing resin is stored in a compressed state in an epoxy resin molding package which is formed by transfermolding with a fluid epoxy resin in a metallic mould under excess pressure at a high temperature.

26. The optical communication device according to claim 24, wherein the pressurizing resin is stored in a compressed state in a ready-made package having a definite shape under excess pressure.

27. The optical communication device according to claim 14, wherein the other optical part is a bottom incidence type PD, a path conversion V-groove is formed along the optical line at an extension of the smaller V-groove, the bottom incidence type PD is mounted on the silicon bench above an end of the path conversion V-groove, and the transparent potting resin covers the fiber end, the path conversion V-groove, the PD and a part of the silicon bench at the gap between the fiber and the PD.

28. The optical communication device according to claim 27, wherein the pressurizing element is two pressurizing balloons which are in contact with both sides of the potting resin, and the two pressurizing balloons are stored in a compressed state in an epoxy resin molding package which is formed by transfermolding with a fluid epoxy resin in a metallic mould under excess pressure at a high temperature.

29. The optical communication device according to claim 27, wherein the pressurizing element is one pressurizing balloon which is in contact with a top of the potting resin, and the pressurizing balloon is stored in a compressed state in an epoxy resin molding package which is formed by transfermolding with a fluid epoxy resin in a metallic mould under excess pressure at a high temperature.

30. The optical communication device according to claim 27, wherein the pressurizing element is a pressurizing resin which covers the potting resin and is in contact with the silicon bench.

31. The optical communication device according to claim 30, wherein the pressurizing resin is stored in a compressed state in an epoxy resin molding package which is formed by transfermolding with a fluid epoxy resin in a metallic mould under excess pressure at a high temperature.

32. The optical communication device according to claim 30, wherein the pressurizing resin is stored in a compressed state in a ready-made package having a definite shape under excess pressure.

33. The optical communication device according to claim 14, wherein the other optical part is an LD and a monitoring PD, the silicon bench has a front step and a rear step, the larger V-groove, the smaller V-groove are formed on the front step, the rear step has a path conversion V-groove, the LD is mounted at an extension of the fiber on the rear step of the silicon bench and the monitoring PD is fitted on the silicon bench above an end of the path conversion V-groove.

34. The optical communication device according to claim 33, wherein the transparent potting resin covers the fiber end, the monitoring PD, the LD, the path conversion V-groove and a part of the silicon bench at the gap between the fiber and the LD and between the LD and the PD.

35. The optical communication device according to claim 34, wherein the pressurizing element is two pressurizing balloons which are in contact with both sides of the potting resin, and the two pressurizing balloons are stored in a compressed state in an epoxy resin molding package which is formed by transfermolding with a fluid epoxy resin in a metallic mould under excess pressure at a high temperature.

36. The optical communication device according to claim 34, wherein the pressurizing element is one pressurizing balloon which is in contact with a top of the potting resin, and the pressurizing balloon is stored in a compressed state in an epoxy resin molding package which is formed by transfermolding with a fluid epoxy resin in a metallic mould under excess pressure at a high temperature.

37. The optical communication device according to claim 34, wherein the pressurizing element is a pressurizing resin which covers the potting resin and is in contact with the silicon bench.

38. The optical communication device according to claim 37, wherein the pressurizing resin is stored in a compressed state in an epoxy resin molding package which is formed by transfermolding with a fluid epoxy resin in a metallic mould under excess pressure at a high temperature.

39. The optical communication device according to claim 37, wherein the pressurizing resin is stored in a compressed state in a ready-made package having a definite shape under excess pressure.

40. The optical communication device according to claim 14, wherein the other optical part is a top incidence PD, a cavity with a bottom and an inner slanting wall is formed along the optical line at an extension of the smaller V-groove, the top incidence PD is mounted on a bottom of the cavity, and the transparent potting resin covers the fiber end, the cavity, the PD and a part of the silicon bench at the gap between the fiber and the PD and the slanting end.

41. The optical communication device according to claim 40, wherein the pressurizing element is two pressurizing balloons which are in contact with both sides of the potting resin.

42. The optical communication device according to claim 41, wherein the two pressurizing balloons are stored in a compressed state in an epoxy resin molding package which is formed by transfermolding with a fluid epoxy resin in a metallic mould under excess pressure at a high temperature.

43. The optical communication device according to claim 40, wherein the pressurizing element is one pressurizing balloon which is in contact with a top of the potting resin, and the pressurizing balloon is stored in a compressed state in an epoxy resin molding package which is formed by transfermolding with a fluid epoxy resin in a metallic mould under excess pressure at a high temperature.

44. The optical communication device according to claim 40, wherein the pressurizing element is a pressurizing resin which covers the potting resin and is in contact with the silicon bench.

45. The optical communication device according to claim 44, wherein the pressurizing resin is stored in a compressed state in an epoxy resin molding package which is formed by transfermolding with a fluid epoxy resin in a metallic mould under excess pressure at a high temperature.

46. The optical communication device according to claim 44, wherein the pressurizing resin is stored in a compressed state in a ready-made package having a definite shape under excess pressure.

47. The optical communication device according to claim 13, wherein one of the optical parts is an optical fiber, the silicon bench has a V-groove along the optical axis for supporting the fiber, and the other optical part is a bottom incidence PD, and the bottom incidence PD is epi-up mounted on the silicon bench at an end of the V-groove.

48. The optical communication device according to claim 1, wherein one of the optical parts is a columnar WDM filter consisting of two triangle glass columns and a dielectric multilayer sandwiched between the triangle glass columns, the other optical part is three optical fibers which face to three surfaces of the columnar WDM filter, the transparent potting resin is supplied to joints among the filter surfaces and the fiber ends, the pressurizing element is in contact to the transparent potting resin and the rigid package encases the pressurizing element and the columnar WDM filter under excess pressure.

49. The optical communication devices according to claim 1, wherein one of the optical parts is an optical fiber, the other optical part is a Y-branched waveguide PD/LD module having a silicon bench, a Y-branched waveguide with a trunk and two branches formed on the silicon bench, an LD mounted at an end of a branch of the Y-branched waveguide and a PD mounted at an end of another branch of the Y-branched waveguide, a potting resin covers the LD and the waveguide end, another potting resin covers PD and the waveguide end, a third potting resin covers the fiber end and the waveguide front, a pressurizing element is supplied upon the silicon bench for covering the PD, the LD and the potting resins and another pressurizing resin is supplied at an interface between the fiber end, the waveguide front and the potting resin on the silicon bench.

50. The optical communication devices according to claim 1, wherein one of the optical parts is an optical fiber held in a ferrule, the other optical part is a PD module having a silicon bench with grooves, a PD mounted at an end of the groove on the silicon bench, an amplifier mounted on the silicon bench for amplifying photocurrent of the PD, a potting resin is supplied upon the PD and the fiber end, and a pressurizing resin is supplied upon the silicon bench covering the potting resin, the fiber and the PD.

* * * * *